(12) United States Patent
Ooishi

(10) Patent No.: US 6,532,183 B2
(45) Date of Patent: Mar. 11, 2003

(54) SEMICONDUCTOR DEVICE CAPABLE OF ADJUSTING INTERNAL POTENTIAL

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,075

(22) Filed: Oct. 23, 2001

(65) Prior Publication Data

US 2002/0186602 A1 Dec. 12, 2002

(30) Foreign Application Priority Data

Jun. 11, 2001 (JP) .................................... 2001-176032

(51) Int. Cl.[7] .................................................. G11C 7/00
(52) U.S. Cl. .................................... 365/201; 365/226
(58) Field of Search .............................. 365/201, 226, 365/227; 327/379, 315, 317, 538, 543

(56) References Cited

U.S. PATENT DOCUMENTS 5,862,096 A * 1/1999 Yasuda et al. ............... 365/229
5,898,316 A * 4/1999 Kato et al. .................... 326/38
6,205,064 B1   3/2001 Ooishi ......................... 365/200
6,331,962 B1 * 12/2001 Kobayashi et al. .......... 365/226

OTHER PUBLICATIONS

"A Programmable BIST Core for Embedded DRAM", Chih–Tsun Hung Et Al., IEEE Design & Test of Computers, Jan.–Mar. 1999, pp. 59–69.

* cited by examiner

Primary Examiner—Michael S. Lebentritt
Assistant Examiner—Ann Phung
(74) Attorney, Agent, or Firm—McDermott, Will & Emery

(57) ABSTRACT

A system LSI comprises a signal generation circuit supplying 16 level set signals one by one to an internal power supply potential generation circuit to increase an internal power supply potential in 16 stages, a compare circuit comparing each internal power supply potential with a reference potential and outputting a signal of a level responsive to the result of comparison and a memory circuit temporarily storing the signal output from the compare circuit. Therefore, an optimum level set signal can be readily detected on the basis of an output signal from the memory circuit.

19 Claims, 18 Drawing Sheets

FIG.9

| STEP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P0 | 0 | 1 | 0 | 1 | 0 | 1 | 0 | 1 | 0 | 1 | 0 | 1 | 0 | 1 | 0 | 1 |
| P1 | 0 | 0 | 1 | 1 | 0 | 0 | 1 | 1 | 0 | 0 | 1 | 1 | 0 | 0 | 1 | 1 |
| P2 | 0 | 0 | 0 | 0 | 1 | 1 | 1 | 1 | 0 | 0 | 0 | 0 | 1 | 1 | 1 | 1 |
| P3 | 1 | 1 | 1 | 1 | 1 | 1 | 1 | 1 | 0 | 0 | 0 | 0 | 0 | 0 | 0 | 0 |
| VRI' | −8 | −7 | −6 | −5 | −4 | −3 | −2 | −1 | 0 | +1 | +2 | +3 | +4 | +5 | +6 | +7 |
| φ44 | L | L | L | L | L | L | H | H | H | H | H | H | H | H | H | H |

SEMICONDUCTOR DEVICE CAPABLE OF ADJUSTING INTERNAL POTENTIAL

BACKGROUND OF THE INVENTION

1. Field of the Invention

The present invention relates to a semiconductor device, and more particularly, it relates to a semiconductor device comprising an internal potential generation circuit capable of adjusting an output potential.

2. Description of the Prior Art

In general, a semiconductor integrated circuit device is provided with an internal power supply potential generation circuit generating an internal power supply potential lower than an external power supply potential and supplying the internal power supply potential to an internal circuit. The output potential from the internal power supply potential generation circuit, dispersed by fluctuation of a fabrication process or the like, is adjustable.

In general, however, an external tester monitors the output potential of the internal power supply generation circuit for adjusting the same, and hence the output potential cannot be readily adjusted.

SUMMARY OF THE INVENTION

Accordingly, a principal object of the present invention is to provide a semiconductor device capable of readily adjusting the internal potential thereof.

The semiconductor device according to the present invention is provided with an internal potential generation circuit receiving a first level set signal including information indicating the level of an internal potential and generating an internal potential of a level responsive to the first level set signal, a signal generation circuit sequentially supplying a plurality of second level set signals one by one as the first level set signal, to the internal potential generation circuit and making the internal potential generation circuit generate a plurality of internal potentials of levels different from each other in a tuning mode for tuning the internal potential, and a compare circuit comparing each internal potential generated in the internal potential generation circuit with a reference potential and outputting a signal of a level responsive to the result of comparison in the tuning mode. Therefore, the second level set signal for generating an internal potential substantially equal to the reference potential can be readily detected on the basis of the signal output from the compare circuit, for readily adjusting the internal potential on the basis of the result of detection.

Preferably, the semiconductor device is further provided with a memory circuit for storing the signal output from the compare circuit. In this case, the signal output from the compare circuit can be temporarily stored in the memory circuit to be thereafter read, whereby the internal potential can be further readily adjusted.

Preferably, the semiconductor device is further provided with a detection circuit detecting the second level set signal for generating an internal potential substantially equal to the reference potential on the basis of the signal output from the compare circuit and a memory circuit for storing the second level set signal detected by the detection circuit. In this case, the semiconductor device itself detects the optimum second level set signal, which in turn can be read from the memory circuit, whereby the internal potential can be further readily adjusted.

Preferably, the compare circuit outputs a signal of a first or second level in response to whether the internal potential generated in the internal potential generation circuit is higher or lower than the reference potential, and the detection circuit includes a logic circuit outputting an activation signal in response to change of the level of the signal output from the compare circuit and a gate circuit receiving the second level set signals generated in the signal generation circuit and supplying the second level set signal to the memory circuit in response to the activation signal output from the logic circuit. In this case, the detection circuit can be readily formed.

Preferably, the semiconductor device is further provided with an internal circuit receiving the internal potential generated in the internal potential generation circuit and performing a prescribed operation, a plurality of signal terminals for transferring signals between the internal circuit and an external world and a scan path circuit connected between two predetermined signal terminals among the plurality of signal terminals for testing the internal circuit, and an output signal from the memory circuit is output to the external world through the scan path circuit. In this case, no individual output terminal for the memory circuit may be provided and hence the number of external terminals can be reduced.

Preferably, the semiconductor device is further provided with a program circuit including at least one fuse for generating a third level set signal including information indicating the level of the internal potential on the basis of whether or not the fuse is blown and a switching circuit supplying the second level set signal generated in the signal generation circuit as the first level set signal to the internal potential generation circuit in the tuning mode while supplying the third level set signal generated in the program circuit as the first level set signal to the internal potential generation circuit in a general operation. In this case, the fuse of the program circuit can be blown on the basis of the result of detection in the tuning mode, for readily adjusting and setting the internal potential.

Preferably, the semiconductor device is further provided with a blowing circuit blowing the fuse of the program circuit so that the program circuit outputs the third level set signal including the same information as the second level set signal stored in the memory circuit in addition to the program circuit and the switching circuit. In this case, the semiconductor device itself blows the fuse of the program circuit, whereby the internal potential can be readily adjusted and set.

Preferably, the semiconductor device operates in synchronization with an external clock signal and further comprises a frequency dividing circuit dividing the frequency of the external clock signal and outputting an internal clock signal, the signal generation circuit operates in synchronization with the internal clock signal and sequentially supplies the plurality of second level set signals one by one as the first level set signal to the internal potential generation circuit in a predetermined cycle, and the compare circuit compares each internal potential with the reference potential when a predetermined time elapses after the signal generation circuit supplies the second level set signal as the first level set signal to the internal potential generation circuit. In this case, the internal potential can be reliably temporarily set and compared.

Preferably, the semiconductor device is further provided with a voltage dividing circuit for dividing an external power supply voltage and generating the reference potential. In this case, a plurality of stages of reference potentials can be generated by changing the external power supply voltage in a plurality of stages.

Preferably, the internal potential generation circuit includes a constant current source connected between a line of an external power supply potential and a prescribed node, a variable resistance circuit, connected between the prescribed node and a line of a ground potential, having a resistance value varying with the first level set signal, a transistor connected between the line of the external power supply potential and a line of the internal potential and a control circuit controlling input voltage of the transistor so that the internal potential matches with the potential of the prescribed node. In this case, the internal potential generation circuit can be readily formed.

Preferably, a plurality of internal potential generation circuits and a plurality of compare circuits are provided, the plurality of internal potential generation circuits generate internal potentials of levels different from each other in response to the same first level set signal, each compare circuit receives a reference potential of a level responsive to the corresponding internal potential, and the semiconductor device further comprises a memory circuit for storing signals output from the plurality of compare circuits. In this case, a plurality of internal potentials can be readily adjusted.

Preferably, the plurality of internal potentials are tuned at timings different from each other, and the semiconductor device is further provided with an input terminal for inputting a reference potential of a level responsive to the currently tuned internal potential and a switching circuit for receiving the signals output from the plurality of compare circuits and supplying the signal output from the compare circuit corresponding to the currently tuned internal potential to the memory circuit. In this case, the plurality of internal potentials can be readily adjusted by changing the level of an external terminal in response to the currently tuned internal potential.

Preferably, the plurality of internal potentials are tuned at timings different from each other, and the semiconductor device is further provided with a voltage dividing circuit for dividing an external power supply voltage for generating a reference potential of a level responsive to the currently tuned internal potential and a switching circuit for receiving the signals output from the plurality of compare circuits and supplying the signal output from the compare circuit corresponding to the currently tuned internal potential to the memory circuit. In this case, the plurality of internal potentials can be readily adjusted by changing the level of the external power supply voltage in response to the currently tuned internal potential.

Preferably, the plurality of internal potentials are tuned at the same timing, and the semiconductor device is further provided with a voltage dividing circuit including a plurality of resistive elements serially connected between a line of an external power supply potential and a line of a ground potential, generating a plurality of reference potentials of levels responsive to the plurality of internal potentials respectively and supplying the plurality of reference potentials to the plurality of compare circuits respectively and a switching circuit for sequentially supplying the signals output from the plurality of compare circuits one by one to the memory circuit every time the signal generation circuit outputs the second level set signal. In this case, the plurality of internal potentials can be simultaneously adjusted in a short time.

Preferably, the plurality of internal potentials are tuned at the same timing, and the semiconductor device is further provided with a voltage dividing circuit including a plurality of resistive elements serially connected between a line of an external power supply potential and a line of a ground potential, generating a plurality of reference potentials of levels responsive to the plurality of internal potentials respectively and supplying the plurality of reference potentials to the plurality of compare circuits respectively and a shift register including a plurality of serially connected registers provided in correspondence to the plurality of compare circuits respectively for temporarily storing signals output from the corresponding compare circuits respectively, for sequentially supplying data stored in the plurality of registers one by one to the memory circuit every time the signal generation circuit outputs the second level set signal. In this case, the shift register serially transfers the signals output from the plurality of compare circuits to the memory circuit, whereby the layout area for signal wires can be reduced.

Preferably, a plurality of internal potential generation circuits are provided, the plurality of internal potential generation circuits generate internal potentials of levels different from each other in response to the same first level set signal, and the plurality of internal potentials are turned at timings different from each other. The semiconductor device is further provided with a voltage dividing circuit including a plurality of resistive elements serially connected between a line of an external power supply potential and a line of a ground potential for generating a plurality of reference potentials corresponding to the plurality of internal potentials respectively and a switching circuit for receiving the plurality of internal potentials and the plurality of reference potentials and supplying the currently tuned internal potential and the reference potential corresponding thereto to the compare circuit. In this case, the plurality of internal potentials can be compared in a single compare circuit to be adjusted, whereby the layout area can be reduced.

Preferably, the semiconductor device is further provided with an internal circuit receiving the internal potential generated in the internal potential generation circuit and performing a prescribed operation, a plurality of signal terminals for transferring signals between the internal circuit and an external world and a scan path circuit connected between two predetermined signal terminals among the plurality of signal terminals for testing the internal circuit, and an output signal from the internal circuit is output to the external world through the scan path circuit. In this case, no individual output terminal may be provided for the memory circuit, whereby the number of external terminals can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates signals P0 to P3 in respective steps in the tuning mode of the system LSI shown in FIGS. 1 to 8, a relative value VRI' of an internal reference potential VRI and an output signal φ44 from a compare circuit 44;

DESCRIPTION OF THE PREFERRED EMBODIMENTS

[First Embodiment]

Figure 1:
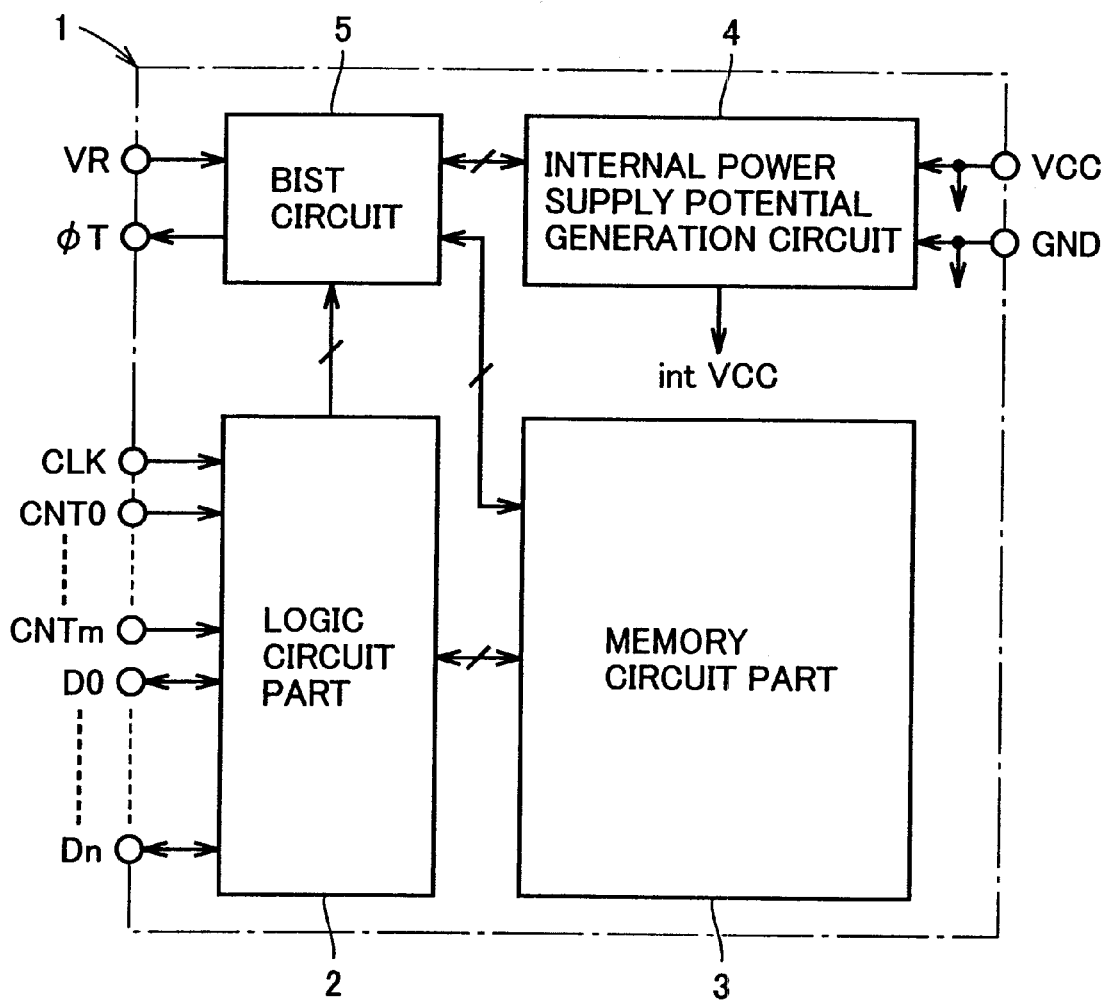
FIG. 1 is a block diagram showing the structure of a system LSI according to a first embodiment of the present invention.

FIG. 1 is a block diagram showing the structure of a system LSI 1 according to a first embodiment of the present invention. Referring to FIG. 1, this system LSI 1 comprises a logic circuit part 2, a memory circuit part 3, an internal power supply potential generation circuit 4 and a BIST (built-in self-testing) circuit 5.

The logic circuit part 2 operates in synchronization with an external clock signal CLK, and performs a prescribed operation according to external control signals CNT0 to CNTm and external data signals D0 to Dn (m and n: integers other than zero). The memory circuit part 3, controlled by the logic circuit part 2, stores data supplied from the logic circuit part 2 and supplies read data to the logic circuit part 2. The internal power supply potential generation circuit 4 generates an internal power supply potential intVCC on the basis of an external power supply potential VCC and an external ground potential GND. The internal power supply potential intVCC is supplied to an internal circuit group of the logic circuit part 2 and the memory circuit part 3.

The BIST circuit 5, controlled by the logic circuit part 2, tests whether or not each of a plurality of memory cell groups included in the memory circuit part 3 is normal and replaces a defective memory cell group with a spare memory cell group. Further, the BIST circuit 5 temporarily sets the internal power supply potential intVCC output from the internal power supply potential generation circuit 4 while comparing the internal power supply potential intVCC with an external reference potential VR and outputting a signal φT of a level responsive to the result of comparison to an external device.

Figure 2:
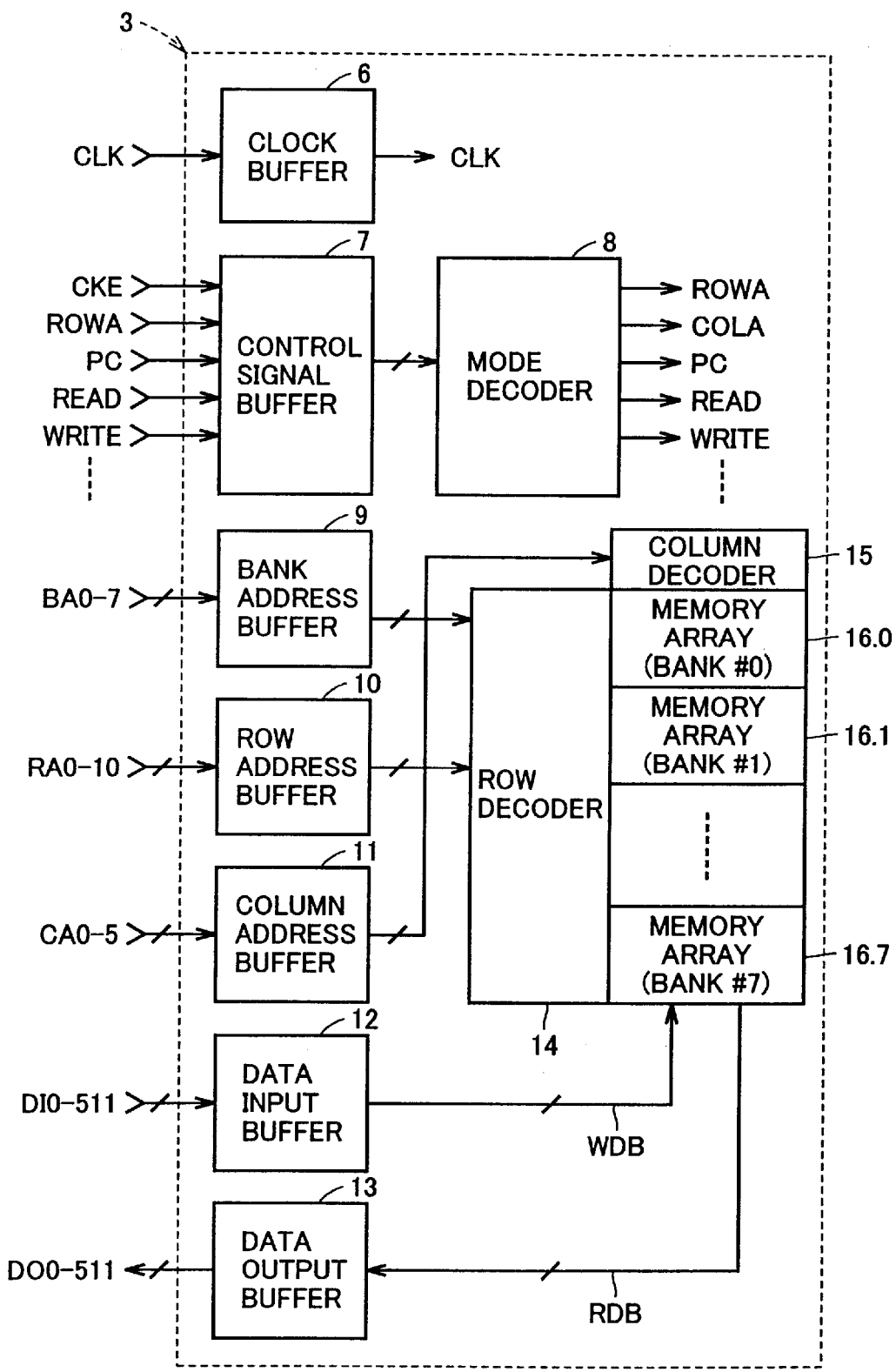
FIG. 2 is a block diagram showing the structure of a memory circuit part shown in FIG. 1.

FIG. 2 is a block diagram showing the structure of the memory circuit part 3. Referring to FIG. 2, the memory circuit part 3 includes a clock buffer 6, a control signal buffer 7, a mode decoder 8, a bank address buffer 9, a row address buffer 10, a column address buffer 11, a data input buffer 12, a data output buffer 13, a row decoder 14, a column decoder 15 and eight memory arrays 16.0 to 16.7 (banks #0 to #7).

The clock buffer 6 supplies the externally supplied clock signal CLK to the overall memory circuit part 3. The mode decoder 8 decodes control signals CKE, ROWA, PC, READ, WRITE, . . . supplied from the logic circuit part 7 through the control signal buffer 7 and generates various internal control signals ROWA, COLA, PC, READ, WRITE, . . . , for controlling the overall memory circuit part 3.

Each of the memory arrays 16.0 to 16.7 includes a plurality of memory cells arranged in the form of a matrix. The plurality of memory cells are previously divided into a plurality of groups each including 512 memory cells. Each group is arranged on a prescribed address specified by row address signals RA0 to RA10 and column address signals CA0 to CA5. Each memory cell stores 1-bit data. Each of the memory arrays 16.0 to 16.7 is provided with a prescribed number of spare memory cell groups for substituting for a defective memory cell group.

The row decoder 14 selects any memory array such as the memory array 16.7, for example, from the eight memory arrays 16.0 to 16.7 along bank address signals BA0 to BA7 supplied from the logic circuit part 2 through the bank address buffer 9, and specifies a row address of the selected memory array 16.7 along row address signals RA0 to RA10 supplied from the logic circuit part 2 through the row address buffer 10.

The column decoder 15 specifies a column address of the selected memory array 16.7 along column address signals CA0 to CA5 supplied from the logic circuit part 2 through the column address buffer 11. The memory cell group (or a spare memory group substituting therefor) of the address specified by the decoders 14 and 15 is connected to first ends of data buses WDB and RDB. Second ends of the data buses WDB and RDB are connected to the data input buffer 12 and the data output buffer 13 respectively.

The data input buffer 12 writes data signals DI0 to DI511 supplied from the logic circuit part 2 in the selected memory cell group (or the spare memory cell group) through the write data bus WDB in a writing mode. The data output buffer 13 supplies data signals DO0 to DO511 read from the selected memory cell group (or the spare memory cell group) to the logic circuit part 2 in a reading mode.

Figure 3:
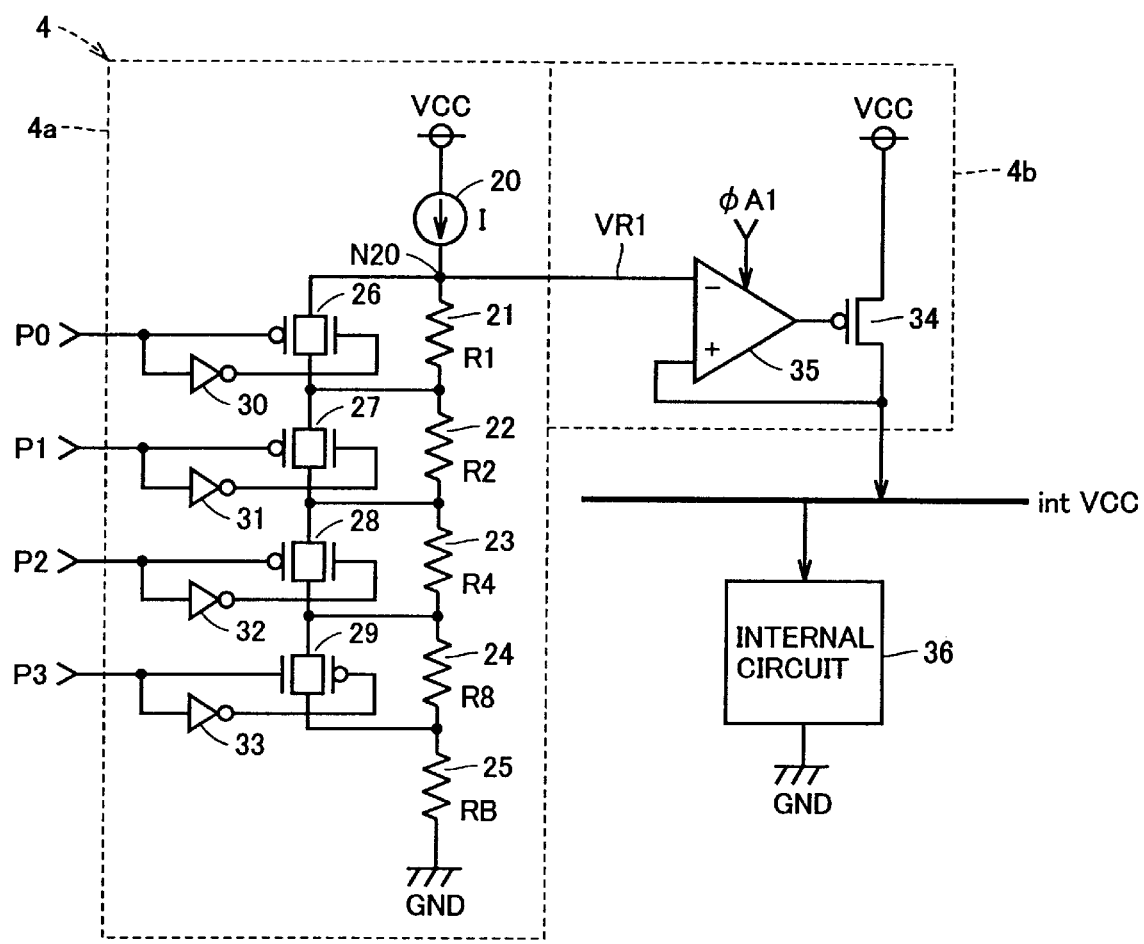
FIG. 3 is a circuit block diagram showing the structure of an internal power supply potential generation circuit shown in FIG. 1.

FIG. 3 is a circuit block diagram showing the structure of the internal power supply potential generation circuit 4. Referring to FIG. 3, this internal power supply potential generation circuit 4 includes a reference potential generation circuit 4a and a driver 4b. The reference potential generation circuit 4a includes a constant current source 20, resistive elements 21 to 25, transfer gates 26 to 29 and inverters 30 to 33. The constant current source 20, connected between a line of the power supply potential VCC and an output node N20, supplies predetermined constant current I to the node N20.

The resistive elements 21 to 25 are serially connected between the output node N20 and a line of the ground potential GND. The resistive elements 21 to 25 have prescribed resistance values R1, R2, R4, R8 and RB respectively. The resistance values R1, R2, R4 and R8 are in ratios 1:2:4:8.

The transfer gates 26 to 29 are connected in parallel with the resistive elements 21 to 24, respectively. Signals P0 to P2 from the BIST circuit 5 are directly input in the gates of P-channel MOS transistors of the transfer gates 26 to 28 respectively, and input in the gates of N-channel MOS transistors of the transfer gates 26 to 28 through the inverters 30 to 32 respectively. A signal P3 from the BIST circuit 5 is directly input in the gate of an N-channel MOS transistor of the transfer gate 29, and input in the gate of a P-channel MOS transistor of the transfer gate 29 through the inverter 33.

A resistance value R between the output node N20 and the line of the ground potential GND is changeable in 16 stages in response to combinations of the logical levels of the signals P0 to P3. When all signals P0 to P3 are low (0), for example, the transfer gates 26 to 28 are rendered conductive while the transfer gate 29 is rendered nonconductive, so that the resistance value R is R8+RB. This resistance value R8+RB is set as a design value. The potential VRI of the output node N20 reaches R×I.

The driver 4b includes a P-channel MOS transistor 34 and an operational amplifier 35. The P-channel MOS transistor 34 is connected between the line of the external power supply potential VCC and a line of the internal power supply potential intVCC. The operational amplifier 35, controlled by a signal φA1, has an inversion input terminal receiving the potential VR1 output from the reference potential generation circuit 4a and a non-inversion input terminal connected to the line of the internal power supply potential intVCC, while its output signal is input in the gate of the P-channel MOS transistor 34.

When the signal φA1 is low (inactivated), the output signal from the operational amplifier 35 is fixed to a high level and the P-channel MOS transistor 34 is rendered nonconductive. When the signal φA1 is high (activated), the operational amplifier 35 controls the gate potential of the P-channel MOS transistor 34 so that the internal power supply potential intVCC matches with the reference potential VR1. Therefore, the internal power supply potential intVCC reaches the same level as the reference potential VR1. For example, an internal circuit 36 of the memory circuit part 3 is driven by the internal power supply potential intVCC and the ground potential GND.

Figure 4:
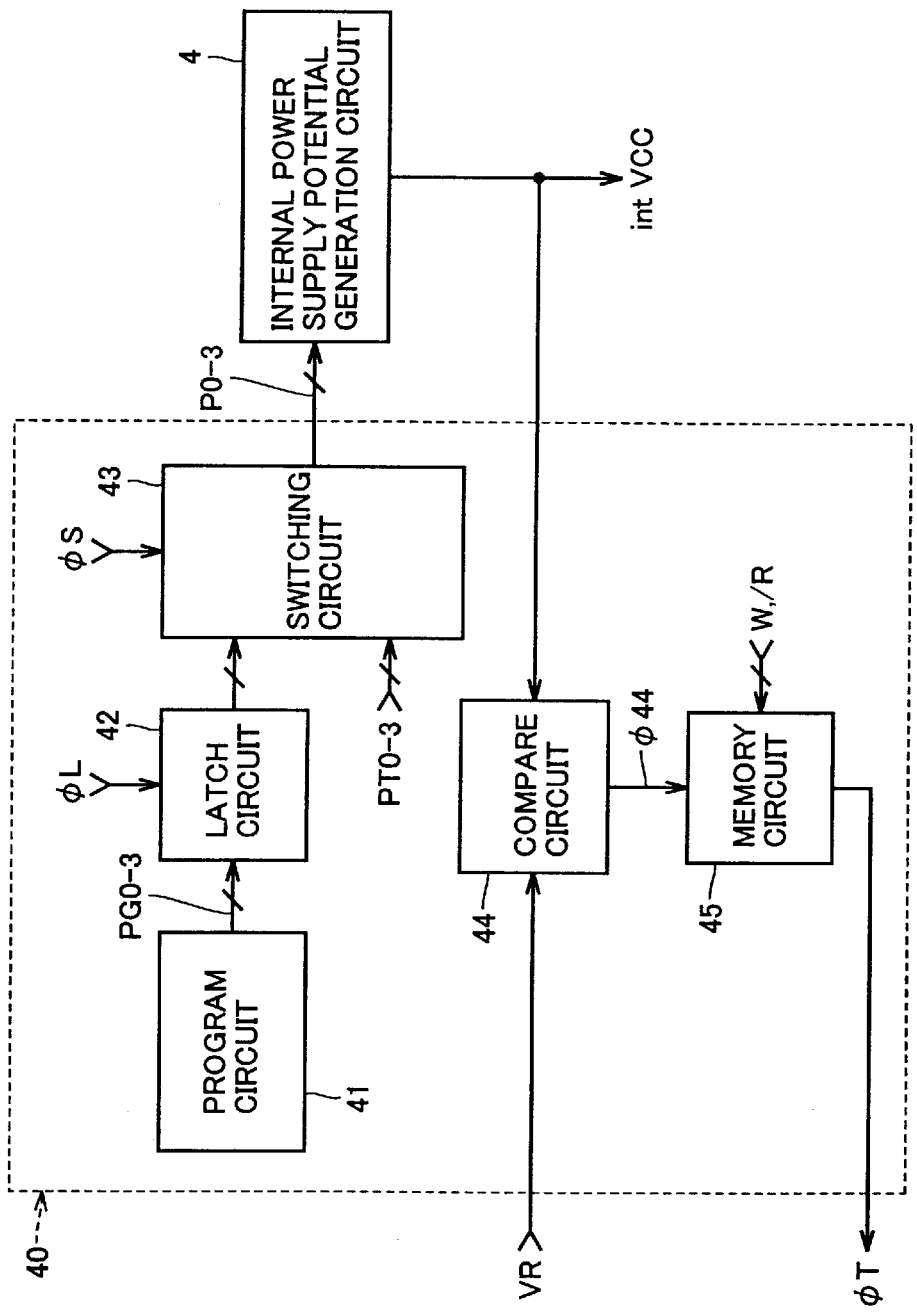
FIG. 4 is a block diagram showing the structure of a tuning circuit included in a BIST circuit shown in FIG. 1.
Figure 5:
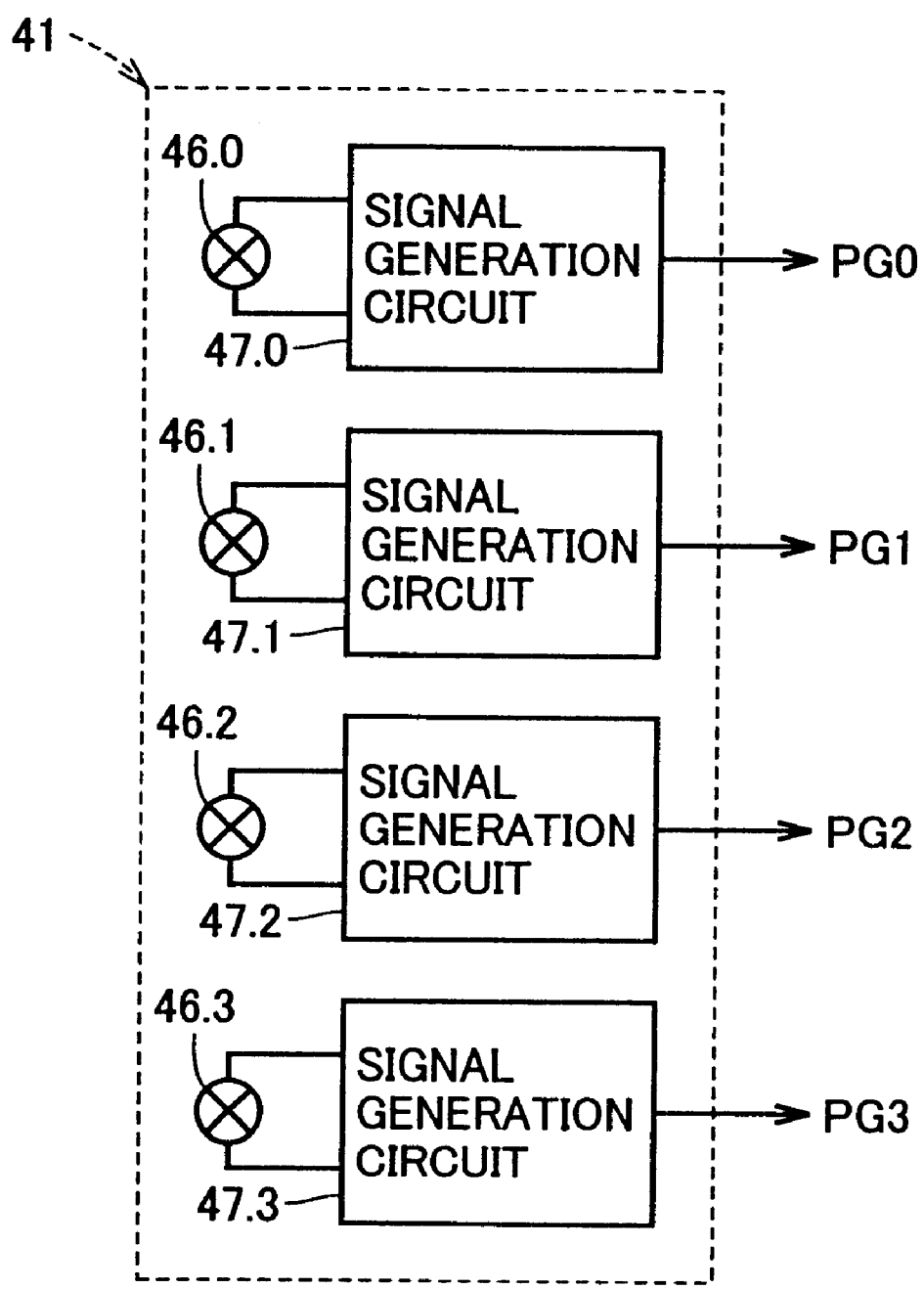
FIG. 5 is a circuit block diagram showing the structure of a program circuit shown in FIG. 4.

FIG. 4 is a block diagram showing the structure of a tuning circuit 40 included in the BIST circuit 5 shown in FIG. 1. Referring to FIG. 4, this tuning circuit 40, controlled by the logic circuit part 2 and a control circuit (not shown) in the BIST circuit 5, includes a program circuit 41, a latch circuit 42, a switching circuit 43, a compare circuit 44 and a memory circuit As shown in FIG. 5, the program circuit 41 includes fuses 46.0 to 46.3 and signal generation circuits 47.0 to 47.3. The signal generation circuits 47.0 to 47.3 bring signals PG0 to PG3 into high levels respectively when the fuses 46.0 to 46.3 are not blown, while bringing the signals PG0 to PG3 into low levels when the fuses 46.0 to 46.3 are blown. The fuses 46.0 to 46.3 are blown by a laser beam.

Referring again to FIG. 4, the latch circuit 42 latches the output signals PG0 to PG3 from the program circuit 41 and supplies the same to the switching circuit 43 responsively when a signal φL is activated to a low level. The switching circuit 43 supplies the signals PG0 to PG3 received from the latch circuit 42 to the internal power supply potential generation circuit 4 as level set signals P0 to P3 when a signal φS is high, while supplying signals PT0 to PT3 from the logic circuit part 2 to the internal power supply potential generation circuit 4 as the level set signals P0 to P3 when the signal φS is low.

Figure 6:
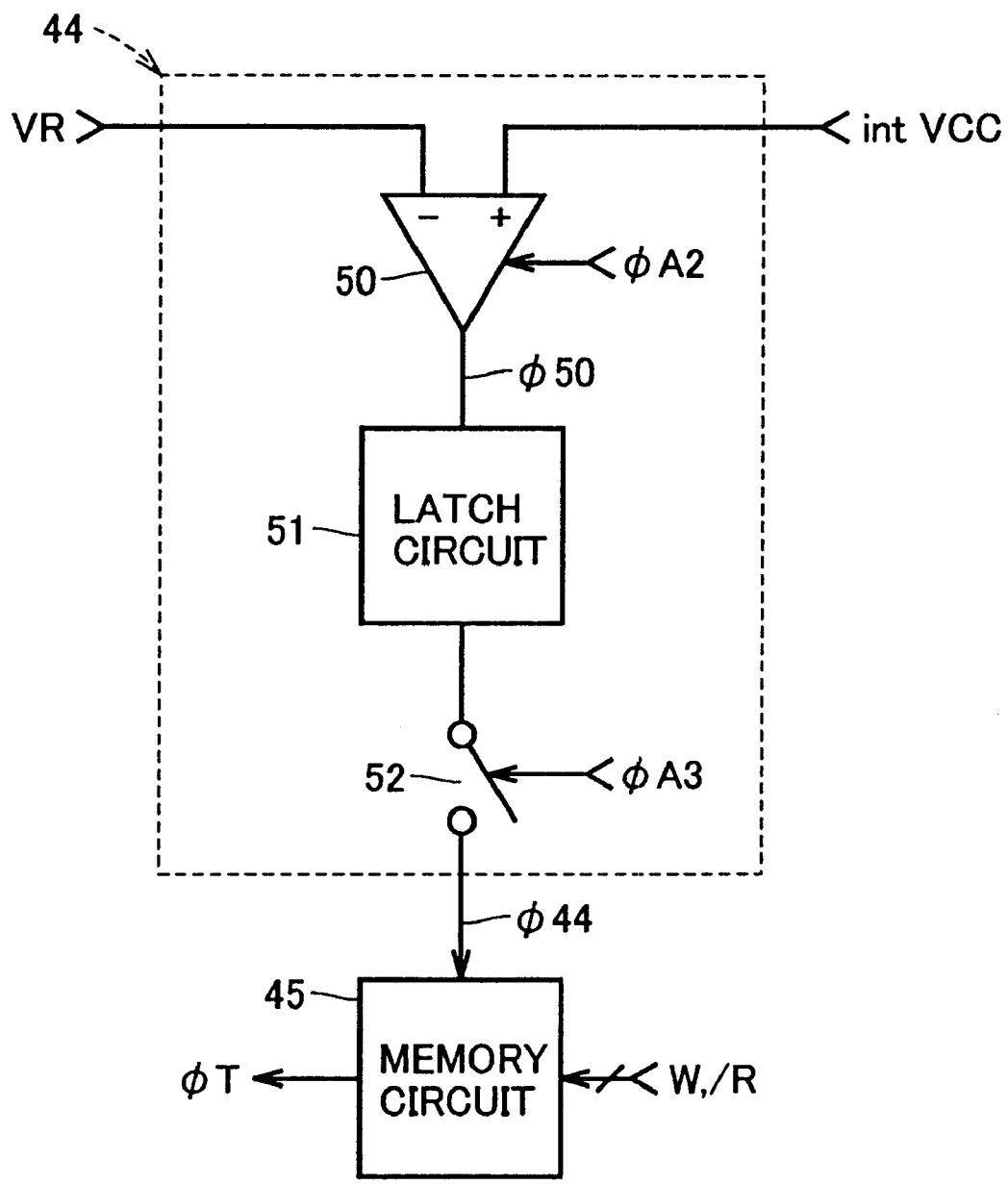
FIG. 6 is a circuit block diagram showing the structure of a compare circuit shown in FIG. 4.

As shown in FIG. 6, the compare circuit 44 includes a comparator 50, a latch circuit 51 and a switch 52. The comparator 50 is activated when a signal φA2 is high (activated) for comparing the internal power supply potential intVCC with the external reference potential VR and bringing a signal φ50 into a low level when the former is lower than the latter while bringing the signal φ50 into a high level when the former is higher than the latter. The latch circuit 51 latches the level of the signal φ50 output from the comparator 50. The switch 52, connected between the output node of the latch circuit 51 and the input node of the memory circuit 45, is rendered conductive responsively when a signal φA3 is activated to a high level for supplying an output signal from the latch circuit 51 to the memory circuit 45.

The memory circuit 45 stores the level of the output signal φ44 from the compare circuit 44 in the input order when a signal W is activated to a high level, while reading and outputting the stored level of the signal φ44 in the input order when a signal /R is activated to a low level. An output signal φT from the memory circuit 45 is supplied to an external tester (not shown).

Figure 7:
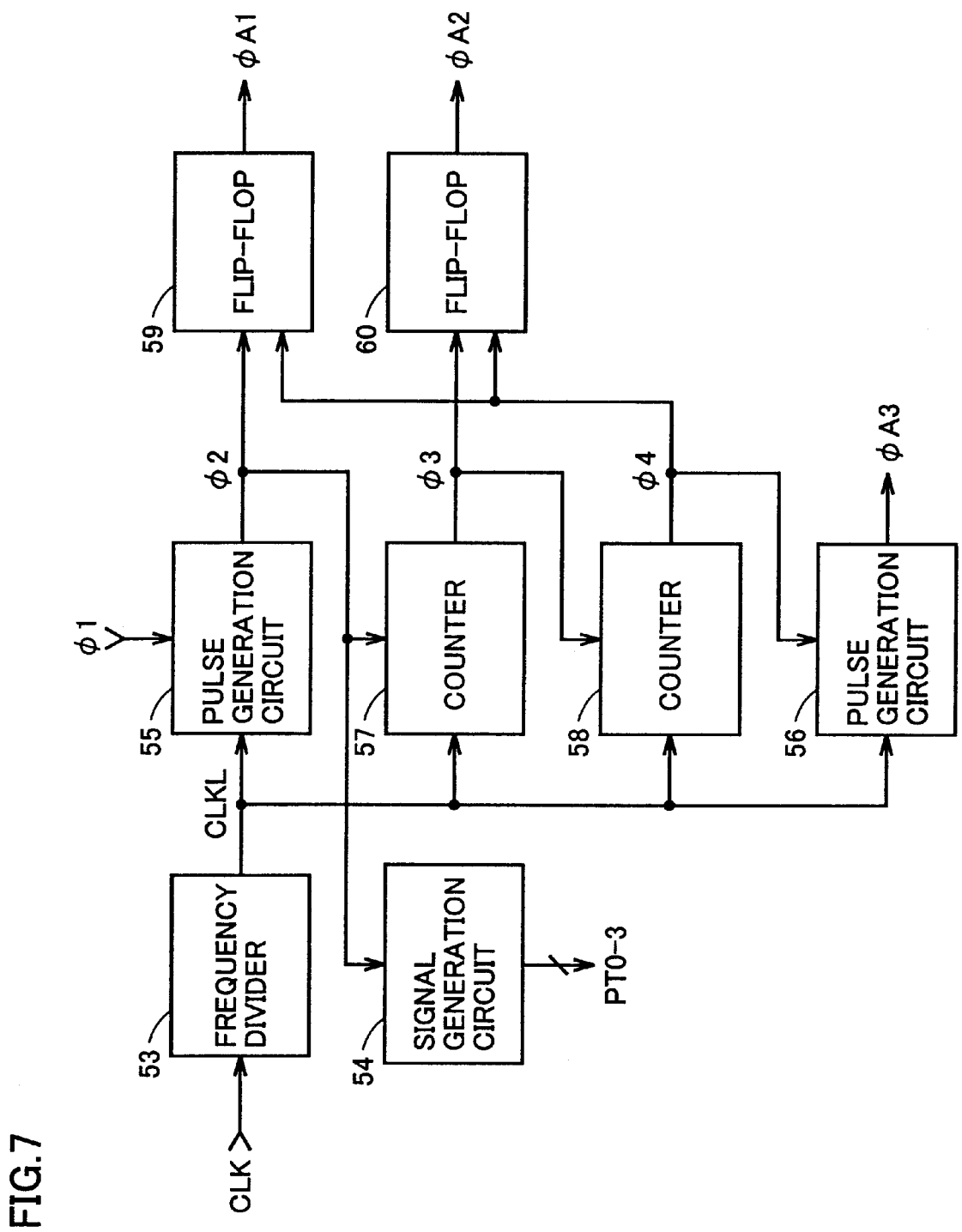
FIG. 7 is a block diagram showing the structure of a part of a logic circuit part shown in FIG. 1 related to control of the tuning circuit.

FIG. 7 is a block diagram showing a part of the logic circuit part 2 shown in FIG. 1 related to control of the tuning circuit 40. Referring to FIG. 7, the logic circuit part 2 includes a frequency divider 53, a signal generation circuit 54, pulse generation circuits 55 and 56, counters 57 and 58 and flip-flops 59 and 60.

The frequency divider 53 divides the frequency the external clock signal CLK of 100 MHz for generating an internal clock signal CLKL of 1 MHz and supplying the same to the pulse generation circuits 55 and 56 and the counters 57 and 58. When a signal φ1 indicating starting of a tuning cycle is activated to a high level by a constant time, the pulse generation circuit 55 responsively brings a signal φ2 into a high level in a pulsed manner in synchronization with the internal clock signal CLKL.

The counter 57 counts pulses of the internal signal CLKL in response to the leading edge of the signal φ2, while bringing a signal φ3 into a high level in a pulsed manner and being reset responsively when counting the pulses by a prescribed number. The counter 58 counts pulses of the internal clock signal CLKL in response to the leading edge of the signal φ3, while bringing a signal φ4 into a high level in a pulsed manner and being reset responsively when counting the pulses by a prescribed number.

The signal generation circuit 54 sets data values of the signals PT0 to PT3 to initial values in response to the first leading edge of the output signal φ2 from the pulse generation circuit 55, and thereafter increments the data values of the signals PT0 to PT3 in response to the leading edge of the signal φ2. The signals PT0 to PT3 are supplied to the switching circuit 43 shown in FIG. 4.

The flip-flop 59 is set on the leading edge of the clock signal CLKL subsequent to the trailing edge of the output signal φ2 from the pulse generation circuit 55 for bringing the signal φA1 into a high level, and reset on the trailing edge of the output signal φ4 from the counter 58 for bringing the signal φA1 into a low level. The signal φA1 is input in the control terminal of the operational amplifier 35 shown in FIG. 3.

The flip-flop 60 is set on the leading edge of the output signal φ3 from the counter 57 for bringing the signal φA2 into a high level, and reset on the trailing edge of the output signal φ4 from the counter 58 for bringing the signal φA2 into a low level. The signal φA2 is input in the control terminal of the comparator 50 shown in FIG. 6.

The pulse generation circuit 56 brings the signal φA3 into a high level in a pulsed manner in response to the leading edge of the clock signal CLKL subsequent to the trailing edge of the output signal φA4 from the counter 58. The signal φA3 is employed for controlling the switch 52 shown in FIG. 6. The signal W of the memory circuit 45 is brought into a high level in a pulsed manner in response to the signal φA3.

Figure 8:
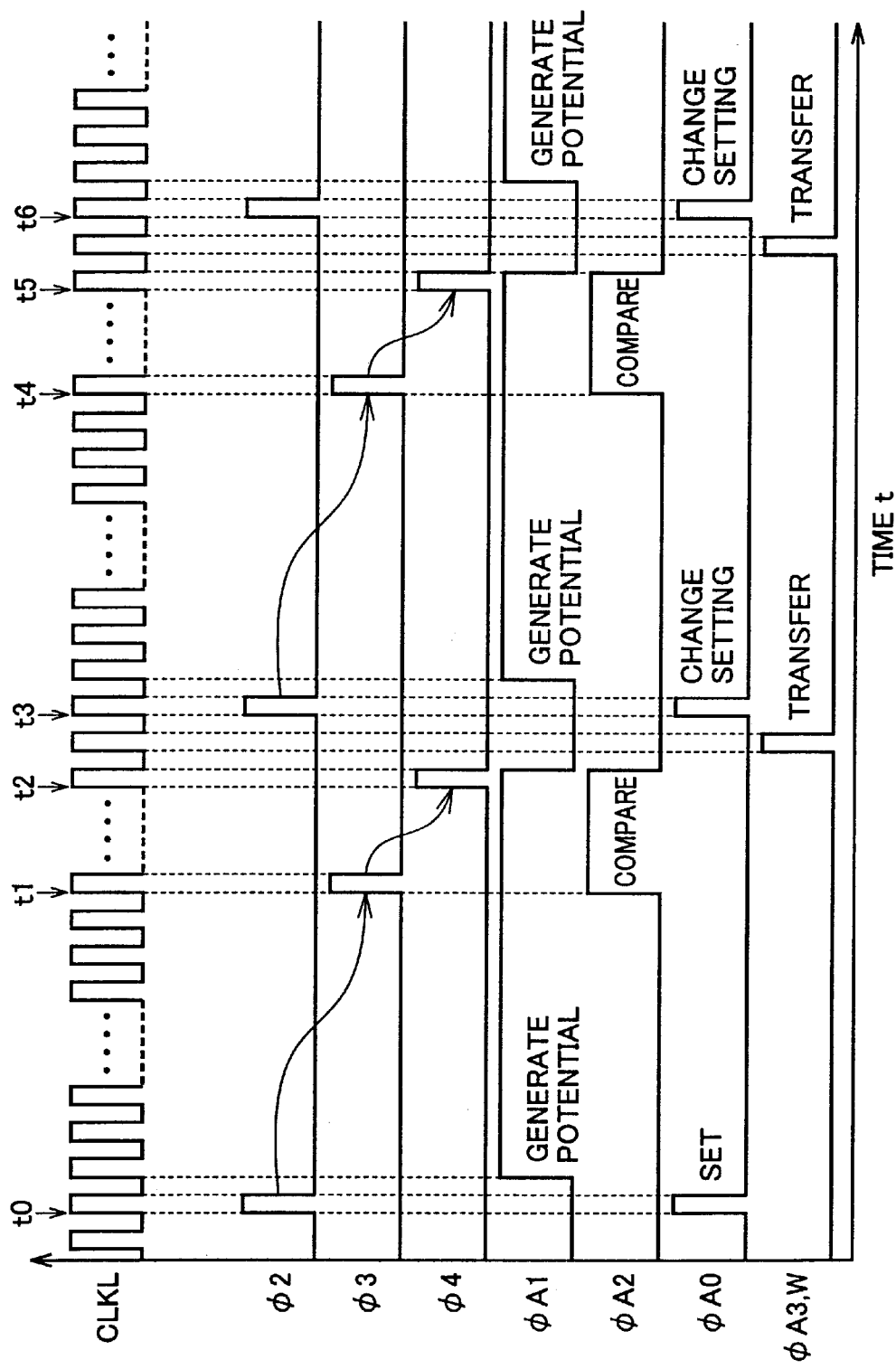
FIG. 8 is a timing chart showing operations of the system LSI shown in FIGS. 1 to 7 in a tuning mode.

FIG. 8 is a timing chart showing operations of the system LSI 1 shown in FIGS. 1 to 7 in a tuning mode. When the tuning mode is set by the external control signals CNT0 to CNTm at a certain time t0, the signal φ1 is brought into a high level by a constant time, and the signal φ2 is brought into a high level in a pulsed manner by the pulse generation circuit 55.

When the signal φ2 goes high, the output signals PT0 to PT3 from the signal generation circuit 54 are set to initial values (0001, for example), while the flip-flop 59 is set so that the signal φA1 goes high. In the tuning mode, the signal φS shown in FIG. 4 is brought into a low level, and the signals PT0 to PT3 are supplied to the internal power supply potential generation circuit 4 through the switching circuit 43.

In the internal power supply potential generation circuit 4 shown in FIG. 3, all transfer gates 26 to 29 are rendered conductive in response to the signals PT0 to PT3 (=0001), and the internal reference potential VRI reaches the minimum level (I×RB). The signal φA1 goes high to activate the operational amplifier 35, for controlling the gate potential of the P-channel MOS transistor so that the internal power supply potential intVCC is equal to the internal reference potential VRI.

When the signal φ2 goes high, the counter 57 starts counting and brings the signal φ3 into a high level in a pulsed manner after a lapse of a prescribed time from the time t0 (time t1). The internal power supply potential intVCC is stabilized during this period (t0 to t1).

When the signal φ3 goes high, the flip-flop 60 is set for bringing the signal φA2 to a high level and activating the comparator 50 shown in FIG. 6. The comparator 50 compares the external reference potential VR with the internal power supply potential intVCC, and outputs a signal 450 of a level responsive to the result of comparison. The signal φ50 is latched by the latch circuit 51 in response to each pulse signal of the clock signal CLKL.

When the signal φ3 goes high, the counter 58 starts counting and brings the signalφ4 to a high level in a pulsed manner after a lapse of a prescribed time from the time t1 (time t2). The external reference potential VR is compared with the internal power supply potential intVCC during this period (t1 to t2). The flip-flops 59 and 50 are reset in response to the trailing edge of the signal φ4, and the signals φA1 and φA2 go low. Thus, the operational amplifier 35 shown in FIG. 3 and the comparator 50 shown in FIG. 6 are inactivated.

The pulse generation circuit 56 brings the signal φA3 to a high level in a pulsed manner in response to the trailing edge of the signal φ4. When the signal φA3 goes high, the switch 52 shown in FIG. 6 is rendered conductive to supply the output signal from the latch circuit 51 to the memory circuit 45 through the switch 52. The signal W is brought into a high level in a pulsed manner along with the signal φA3, and the output signal from the latch circuit 51 is written in a prescribed address of the memory circuit 45. Thus, a step in the tuning mode is terminated. This step is repeated by a prescribed number of times (16 times, for example).

FIG. 9 illustrates the signals P0 to P3, the relative value VRI' of the internal reference potential VRI and the output signal φ44 from the compare circuit 44 in the respective steps of the tuning mode. Referring to FIG. 9, 16 steps are carried out in the tuning mode. The signals P3 to P0 change as 1000, 1001, . . . , 1111, 0000, 0001, . . . , 0111 in the 16 steps. Assuming that the internal reference potential VRI is zero when the signals P3 to P0 are 0000, the relative value VRI' of the internal reference potential VRI changes as −8, −7, . . . , −1, 0, 1, . . . , +7 in the 16 steps. The output signal φ44 from the compare circuit 44 goes low in the steps 1 to 6, and goes high in the steps 7 to 16, for example. This indicates that the internal power supply potential intVCC is lower than the external reference potential VR in the steps 1 to 6 while the former is higher than the latter in the steps 7 to 16.

The output signal φ44 from the compare circuit 44 is written in the memory circuit 45 shown in FIG. 6 in the step order, as described above. After the 16 steps are completed, the signal /R is activated to a low level, for reading the signal φ44 written in the memory circuit 45 in the step order. The output signal φT from the memory circuit 45 is output to the external tester. The tester obtains the optimum values of the signals P0 to P3 on the basis of this signal φT. Referring to FIG. 9, the value 0111 obtained when the signal φT goes high from a low level is determined as the optimum value for the signals P0 to P3. Thus, the tuning mode is terminated.

Then, fuses are blown so that the output signals PG0 to PG3 from the program circuit 41 reach the optimum value 0111 for the signals P0 to P3 obtained in the tuning mode. In this case, three fuses 46.1 to 46.3 are blown among the fuses 46.0 to 46.3 shown in FIG. 5. When the fuses 46.1 to 46.3 are blown, the signals PG1 to PG3 go high (1), and the signals PG0 to PG3 reach 0111.

When power is supplied in a general operation, the signal φL is brought into a high level after a lapse of a prescribed time and the latch circuit 42 shown in FIG. 4 latches the signals PG0 to PG3. In the general operation, the signal φS goes high and the output signals PG0 to PG3 from the latch circuit 42 are supplied to the internal power supply potential generation circuit 4 through the switching circuit 43. The internal power supply potential generation circuit 44 outputs the internal power supply potential intVCC substantially equal in level to the external reference potential VR.

The LSI 1 according to the first embodiment changes the signals P0 to P3 in 16 stages, for example, for comparing the internal power supply potential intVCC with the external reference potential VR and outputting the signal φT indicating the result of comparison to the external device. Therefore, the values of the signals P0 to P3 for substantially equalizing the internal power supply potential intVCC to the external reference potential VR can be readily obtained on the basis of the signal φT, for readily adjusting the internal power supply potential intVCC.

While the internal power supply potential intVCC is sequentially increased in the 16 steps in the tuning mode according to the first embodiment, the present invention is not restricted to this but the internal power supply potential intVCC may alternatively be sequentially reduced or sequentially increased from the reference level (level corresponding to VRI'=0 in FIG. 9) to the maximum level (level corresponding to VRI'=−7) and thereafter sequentially reduced from the reference level to the minimum level (level corresponding to VRI'=−7).

[Second Embodiment]

Figure 10:
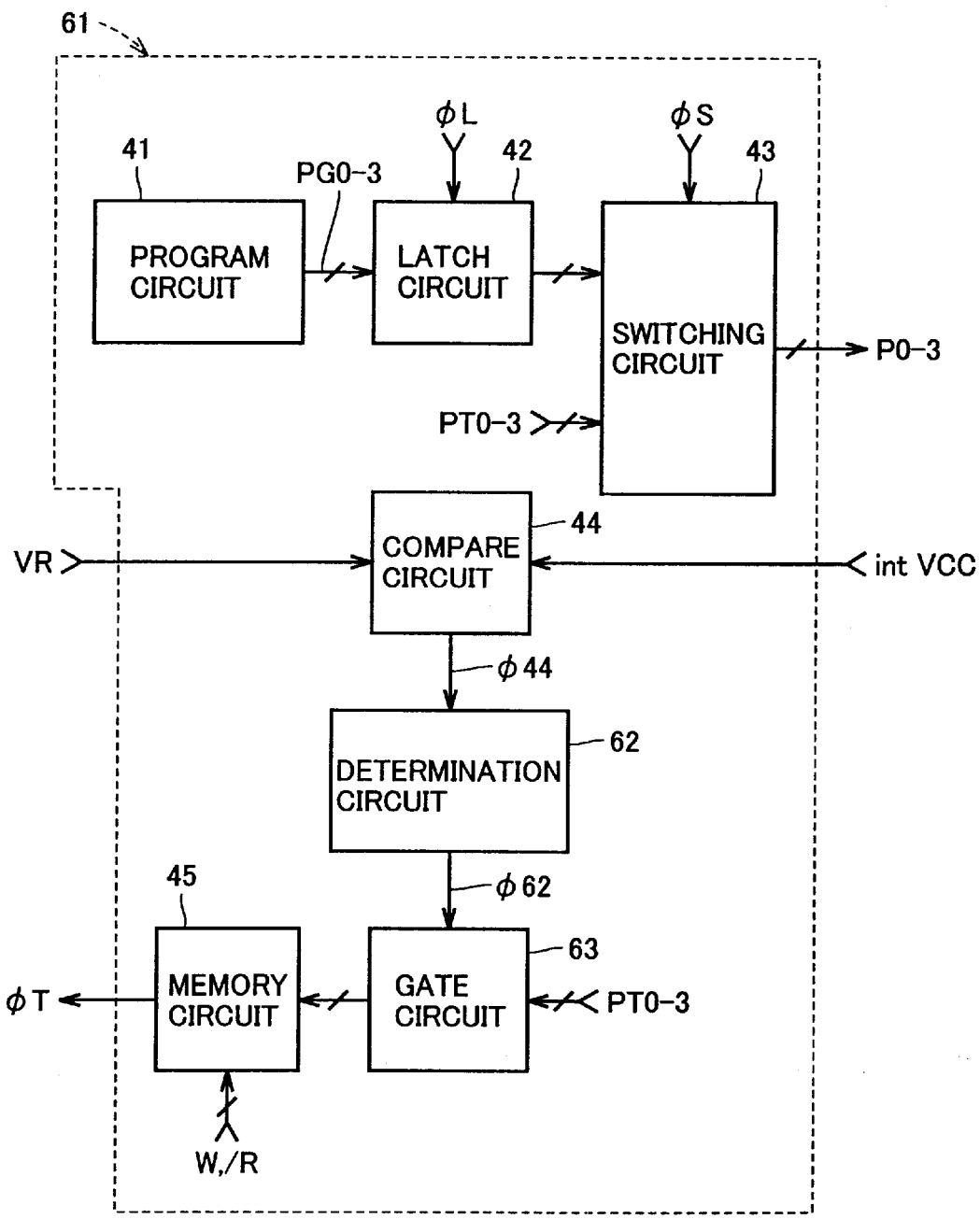
FIG. 10 is a block diagram showing the structure of a tuning circuit of a system LSI according to a second embodiment of the present invention.

FIG. 10 is a block diagram showing the structure of a tuning circuit 61 of a system LSI according to a second embodiment of the present invention in contrast with FIG. 4.

Figure 11:
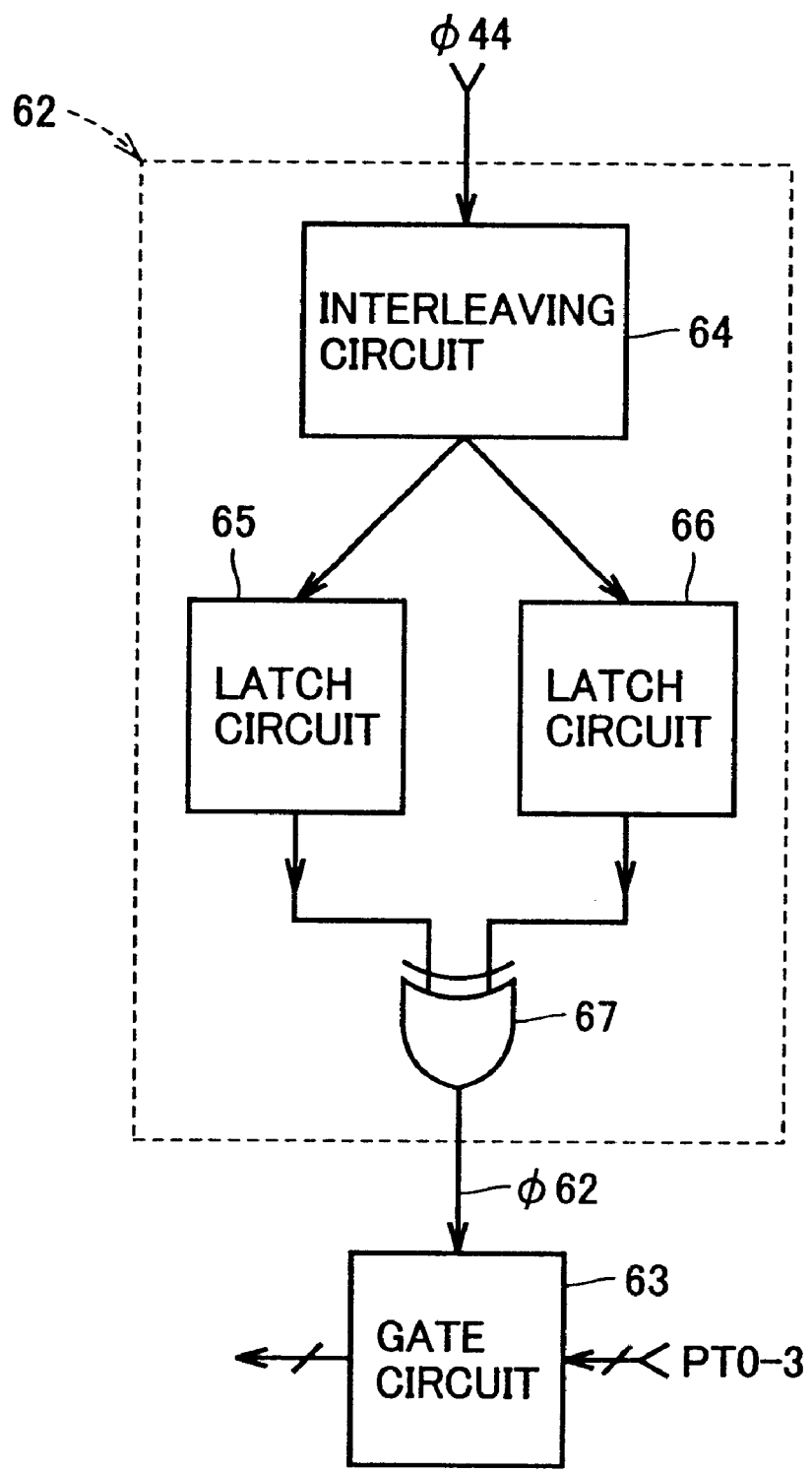
FIG. 11 is a circuit block diagram showing the structure of a determination circuit shown in FIG. 10.

Referring to FIG. 10, this tuning circuit 61 is different from the tuning circuit 40 shown in FIG. 4 in a point that a determination circuit 62 and a gate circuit 63 are added thereto. As shown in FIG. 11, the determination circuit 62 includes an interleaving circuit 64, latch circuits 65 and 66 and an EX-OR gate 67. The interleaving circuit 64 first supplies a low level to the latch circuit 54, thereafter alternately supplies the levels of 16 steps of the signal φ44 shown in FIG. 9 to the latch circuits 66 and 65, and finally supplies a high level to the latch circuit 66. The latch circuits 65 and 66 latch the signal levels received from the interleaving circuit 64 and supply the same to the EX-OR gate 67.

The EX-OR gate 67 brings a signal φ62 to a low level when the output levels of the latch circuits 65 and 66 match with each other, while bringing the signal φ62 into a high level when the output signal levels mismatch with each other. For example, the signal φ62 goes high only in the step 7 where the signal φ44 changes from a low level to a high level, while the signal φ62 goes low in the remaining steps 1 to 6 and 8 to 16 in FIG. 9.

Referring again to FIG. 10, the gate circuit 63 supplies signals PT0 to PT3 to a memory circuit 45 in response to the leading edge of the output signal φ62 from the determination circuit 62. In FIG. 9, the signals PT0 to PT3 (=0111) in the step 7 are supplied to the memory circuit 45. The memory circuit 45 stores the signals PT0 to PT3 (=0111) from the gate circuit 63, reads the signals PT0 to PT3 (=0111) responsively when a signal /R is activated to a low level, and sequentially outputs the read signals PT0 to PT3 one by one to an external device.

According to the second embodiment, the signals PT0 to PT3, i.e., P0 to P3, for substantially equalizing an internal power supply potential intVCC to an external reference potential VR are obtained in the system LSI and output to the external device. As compared with the first embodiment outputting the output signal φ44 from the compare circuit 44 through the memory circuit 45, therefore, the optimum values of the signals P0 to P3 can be more readily obtained for readily adjusting the internal power supply potential intVCC.

Figure 12:
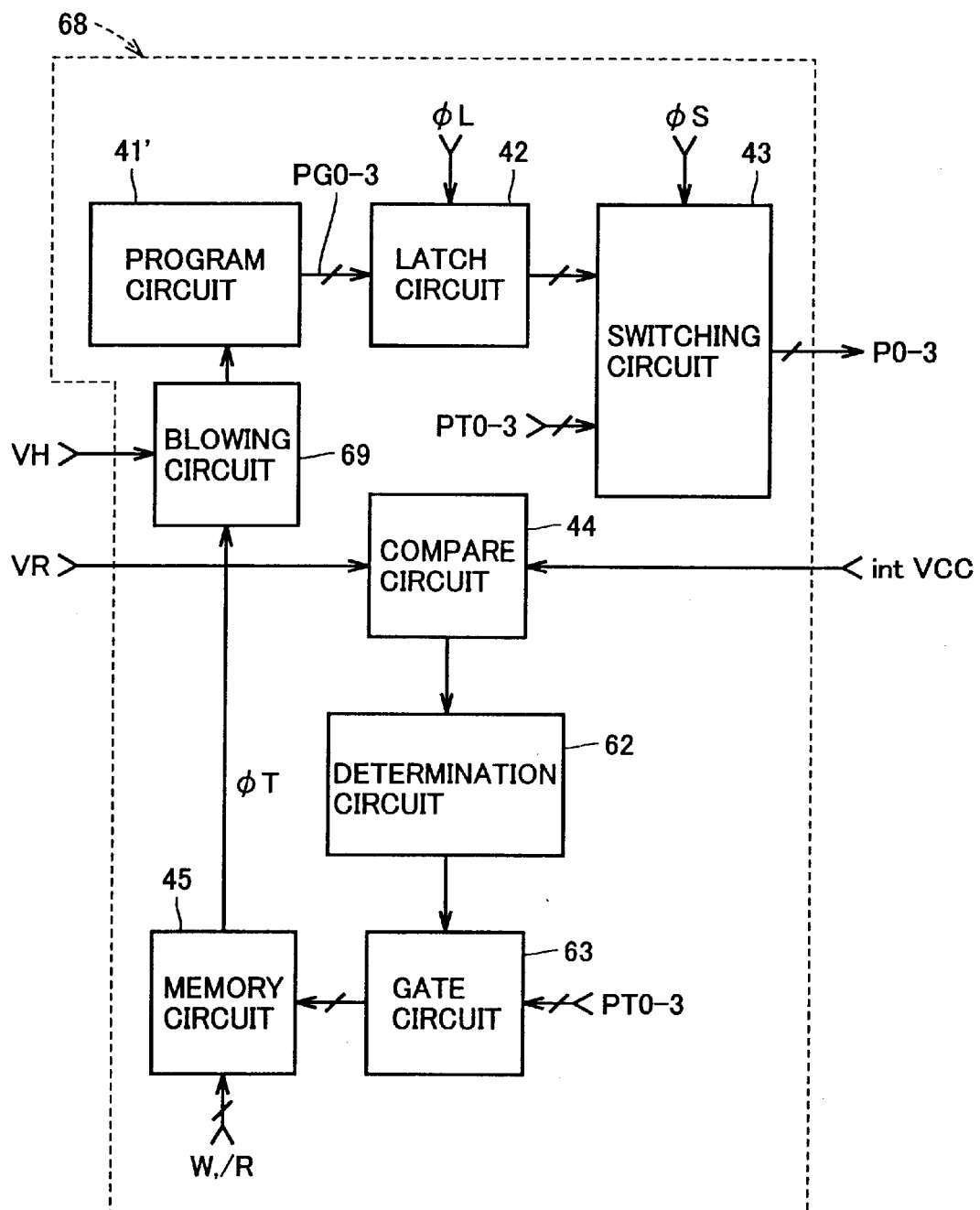
FIG. 12 is a block diagram showing a modification of the system LSI according to the second embodiment.

FIG. 12 is a block diagram showing a modification of the second embodiment. Referring to FIG. 12, a tuning circuit 68 according to this modification is different from the tuning circuit 61 shown in FIG. 10 in a point that a blowing circuit 69 is added thereto while a program circuit 41' substitutes for the program circuit 41. The program circuit 41' is obtained by replacing each of the fuses 46.0 to 46.3 of the program circuit 41 shown in FIG. 5 with an electric fuse. The electric fuse is blown by application of voltage. The blowing circuit 69 selectively blows each of four electric fuses along signals PT0 to PT3 (0111, for example) read from a memory circuit 45. High voltage VH for blowing the electric fuse is externally supplied to the blowing circuit 69 through a prescribed signal terminal (terminal for an external control signal CNT0, for example) of the system LSI. According to this modification, the system LSI itself also blows the fuse, and hence an internal power supply potential intVCC can be more readily adjusted.

[Third Embodiment]

Figure 13:
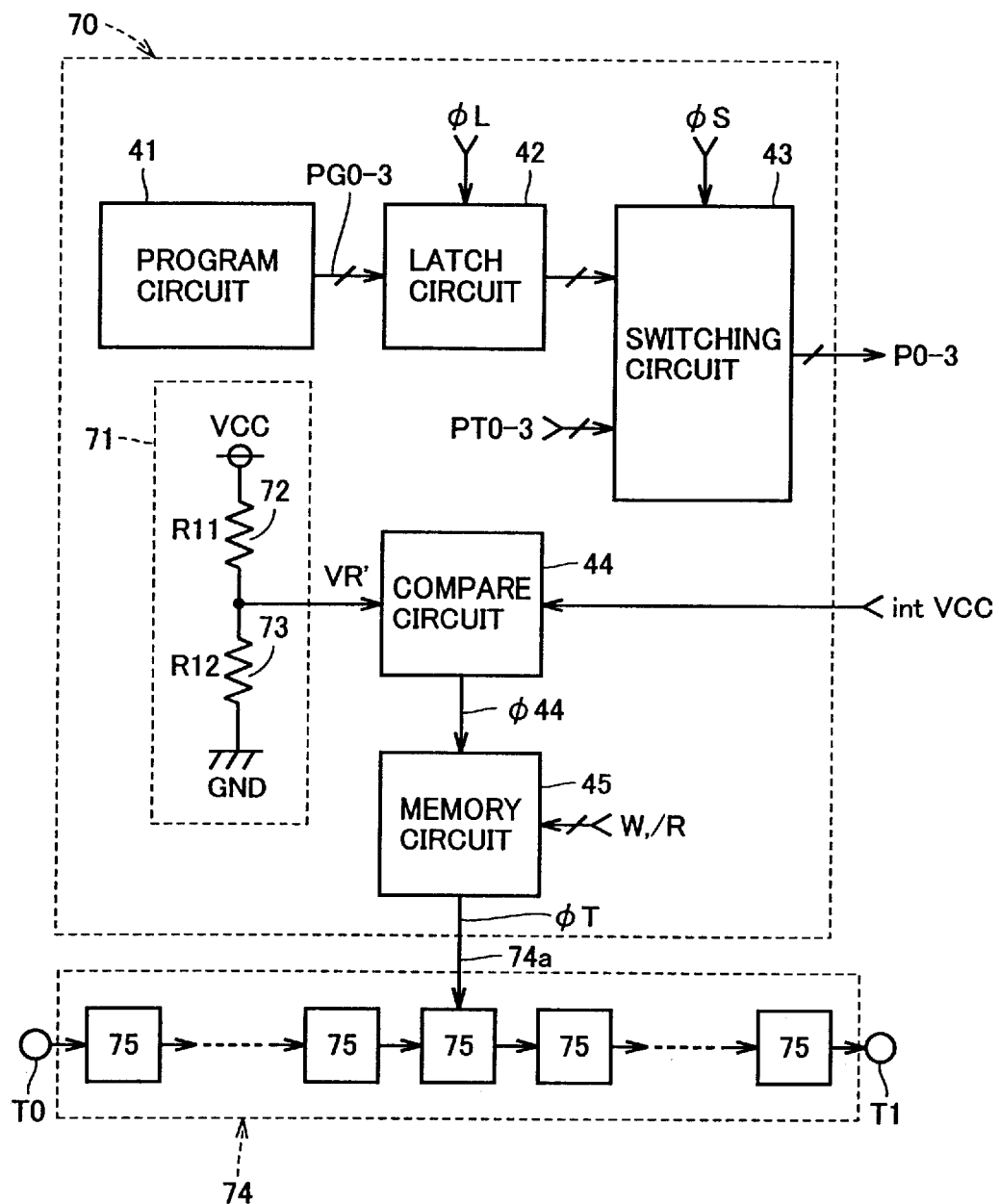
FIG. 13 is a circuit block diagram showing a principal part of a system LSI according to a third embodiment of the present invention.

FIG. 13 is a circuit block diagram showing a principal part of a system LSI according to a third embodiment of the present invention in contrast with FIG. 4.

Referring to FIG. 13, this system LSI is different from the system LSI according to the first embodiment in a point that a tuning circuit 70 substitutes for the tuning circuit 40 and a point that an input terminal for inputting an external reference potential VR as well as an output terminal dedicated to a signal φT are deleted.

The tuning circuit 70 is obtained by adding a voltage dividing circuit 71 to the tuning circuit 40. The voltage dividing circuit 71 includes two resistive elements 72 and 73 serially connected between a line of an external power supply potential VCC and a line of a ground potential GND. The ratio R11/R12 of the resistance value R11 of the resistive element 72 to the resistance value R12 of the resistive element 73 is so set that an output potential VR' of the voltage dividing circuit 71 is equal to an external reference potential VR. While the resistance values R11 and R12 of the resistive elements 72 and 73 are dispersed due to dispersion in a fabrication process, the ratio R11/R12 remains unchanged.

A compare circuit 44 compares an output potential VR' from the voltage dividing circuit 71 with an internal power supply potential intVCC. An output signal φT from a memory circuit 45 is input in a sub-input terminal 74a of a scan path circuit 74. The scan path circuit 74 is one of a number of scan path circuits provided in the system LSI for testing whether or not an internal circuit of the system LSI is normal. The scan path circuit 74 includes a plurality of registers 75 serially connected between a certain terminal T0 (terminal for a data signal D0, for example) and another terminal T1 (terminal for a data signal D1, for example).

The initial register 75 holds a signal externally received through the terminal T0 and supplies a precedently received signal to the subsequent register 75. Each register 75 holds a signal supplied from the precedent register 75 and supplies the precedently received signal to the subsequent register 75. The final register 75 holds the signal supplied from the precedent register T5 and outputs the precedently received signal through the terminal T1. The initial register 75 among the plurality of registers 75 holds the signal φT supplied from the memory circuit 45 through the sub-input terminal 74a and supplies the precedently received signal to the subsequent register 75. Therefore, the output signal φT from the memory circuit 45 is output to an external device through the scan path circuit 74 and the prescribed terminal T1.

The system LSI according to the third embodiment divides the external power supply potential VCC for generating the reference potential VR' and outputting the output signal φT from the memory circuit 45 to the external terminal through the scan path circuit 74, whereby a terminal for inputting the external reference potential VR and a terminal for extracting the output signal φT from the memory circuit 45 can be deleted so that the number of signal terminals can be reduced.

While the voltage dividing circuit 71 is provided in a single chip in the third embodiment, such a single voltage dividing circuit 71 may alternatively be provided in common for a plurality of chips formed on a single semiconductor wafer.

[Fourth Embodiment]

Figure 14:
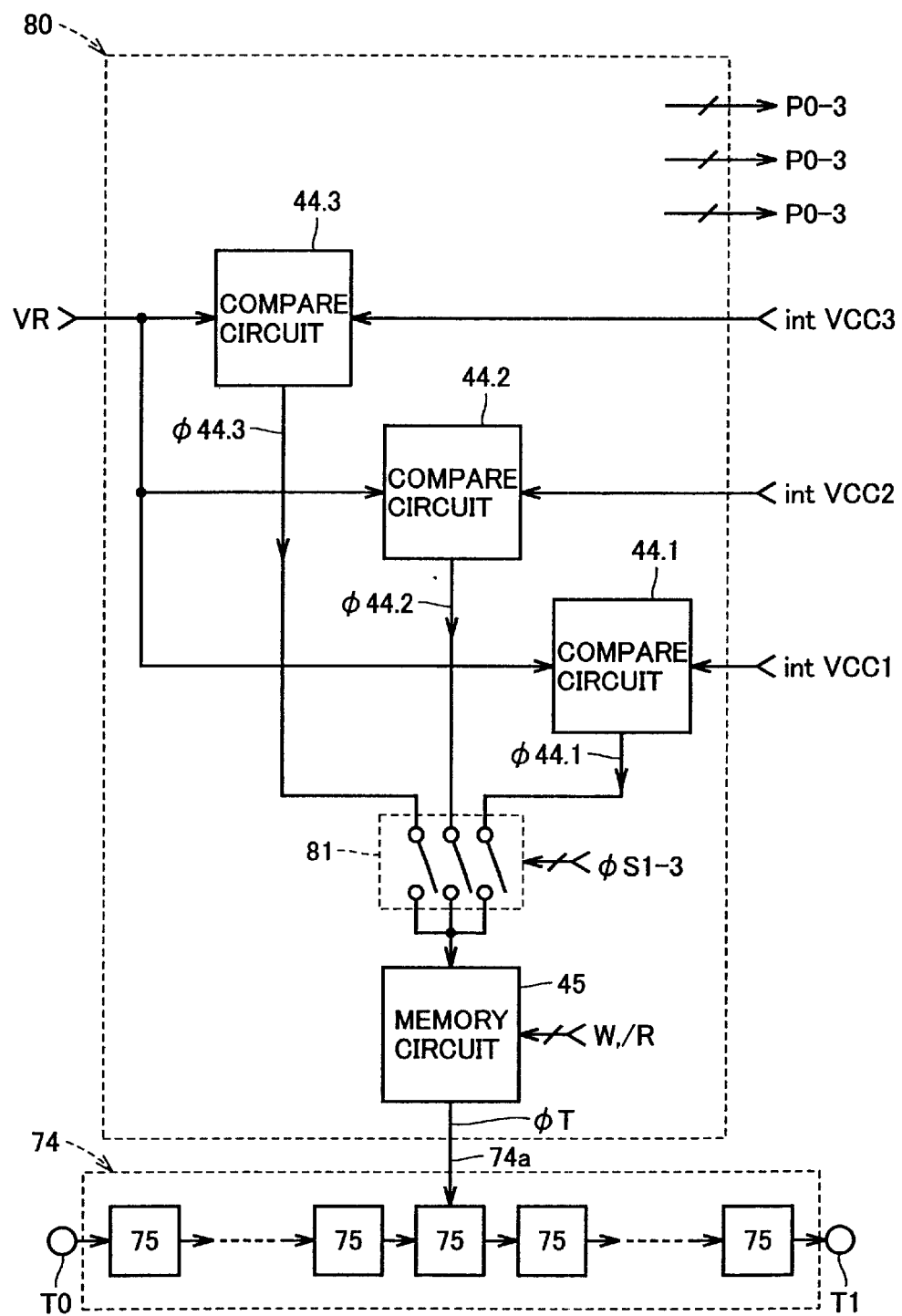
FIG. 14 is a circuit block diagram showing a principal part of a system LSI according to a fourth embodiment of the present invention.

FIG. 14 is a circuit block diagram showing a principal part of a system LSI according to a fourth embodiment of the present invention in contrast with FIG. 13.

Referring to FIG. 14, this system LSI is different from the system LSI according to the third embodiment in a point that a plurality of (three in this case) internal power supply potential generation circuits are provided and a point that a tuning circuit 80 substitutes for the tuning circuit 70.

The three internal power supply potential generation circuits (not shown) output internal power supply potentials intVCC1 to intVCC3 different from each other respectively. The tuning circuit 80 includes three compare circuits 44.1 to 44.3, a switching circuit 81 and a memory circuit 45. The compare circuits 44.1 to 44.3 compare an external reference potential VR with the internal power supply potentials intVCC1 to intVCC3 respectively and output signals of levels responsive to the results of comparison. The three internal power supply potentials intVCC1 to intVCC3 are tuned at timings different from each other. The level of the external reference potential VR is switched in response to the tuned internal power supply potential. The switching circuit 81 is controlled by signals φS1 to φS3 for supplying any of output signals φ44.1 to φ44.3 from the compare circuits 44.1 to 44.3 to the memory circuit 45. An output signal φT from the memory circuit 45 is output to an external device through a scan path circuit 74 and a terminal T1.

The tuning circuit 80 includes three program circuits 41 (not shown), three latch circuits 42 (not shown) and three switching circuits 43 (not shown) corresponding to the three internal power supply potential generation circuits.

The system LSI according to the fourth embodiment writes the output signals φ44.1 to φ44.3 from the three compare circuits 44.1 to 44.3 in the single memory circuit 45 and extracts the output signal φT from the memory circuit 45 through the scan path circuit 74 and the terminal T1, whereby the number of external terminals can be reduced.

Figure 15:
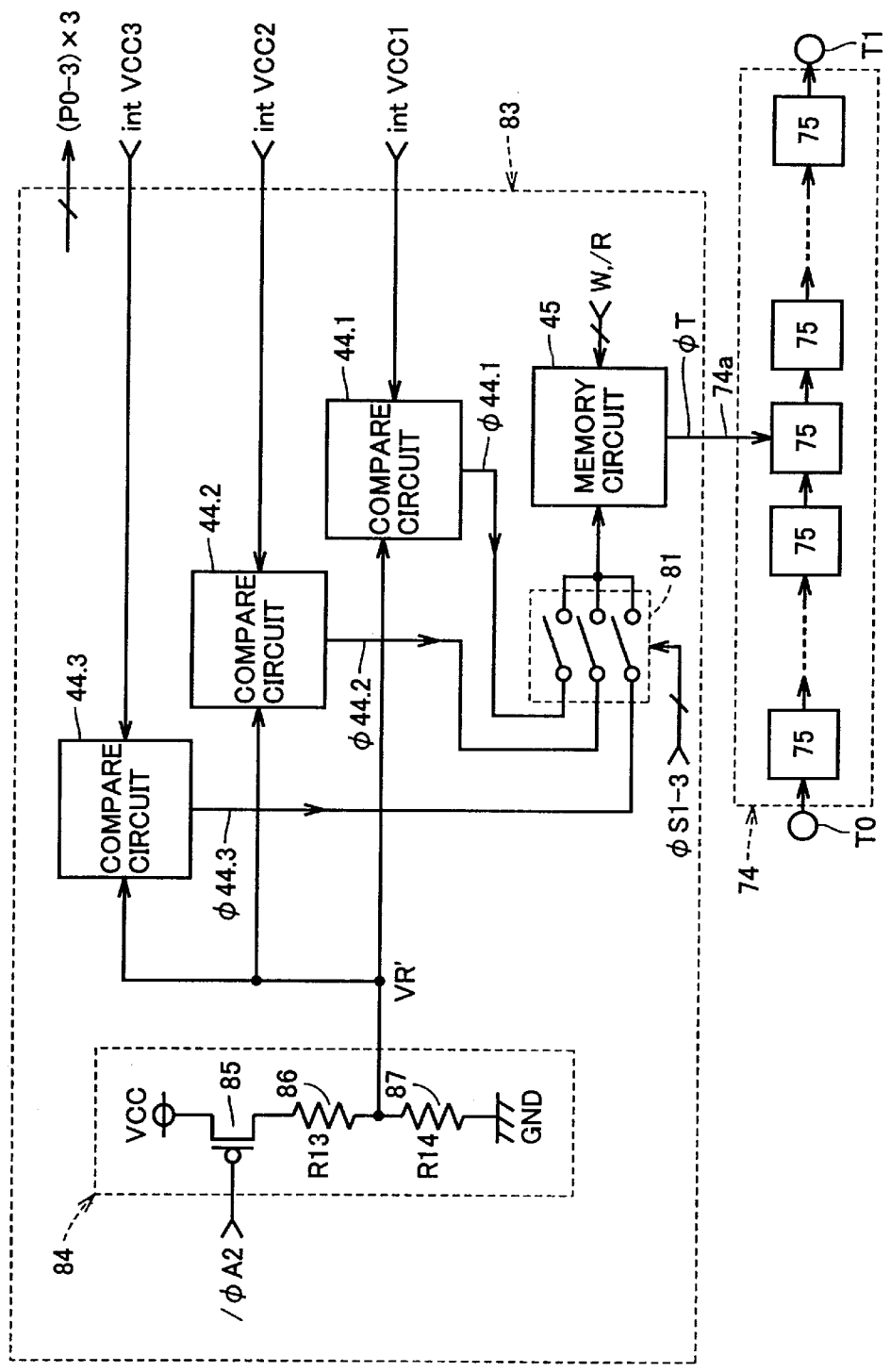
FIG. 15 illustrates a modification of the system LSI according to the fourth embodiment.

Modifications of the fourth embodiment are now described. FIG. 15 shows a tuning circuit 83 obtained by adding a voltage dividing circuit 84 to the tuning circuit 80 shown in FIG. 14. The voltage dividing circuit 84 includes a P-channel MOS transistor 85 and resistive elements 86 an 87 serially connected between a line of an external power supply potential VCC and a line of a ground potential GND. The P-channel MOS transistor 85 receives an inverted signal /φA2 of the signal φA2 shown in FIGS. 7 and 8. Therefore, the P-channel MOS transistor 85 is rendered conductive only when compare circuits 44.1 to 44.3 are activated. The ratio R13/R14 of the resistance value R13 of the resistive element 86 to the resistance value R14 of the resistive element 87 is set to a prescribed value. An output potential VR' from the voltage dividing circuit 84 is equal to VCC× R14/(R13+R14).

Three internal power supply potentials intVCC1 to intVCC3 are tuned at timings different from each other. The level of the external power supply potential VCC, i.e., the level of the reference potential VR' is switched in response to the tuned internal potential. In order to switch the reference potential VR' in three stages of 1.6 V, 1.8 V and 2.0 V in response to the internal power supply potentials intVCC1 to intVCC3 while setting the voltage dividing ratio R14/(R13+R14) to 2/3, for example, the external power supply potential VCC may be switched in three stages of 2.4 V, 2.7 V and 3 V. According to this modification, the reference potential VR' is generated by dividing the external power supply potential VCC, whereby a terminal for receiving the external reference potential VR may be deleted and the number of external terminals can be reduced.

Figure 16:
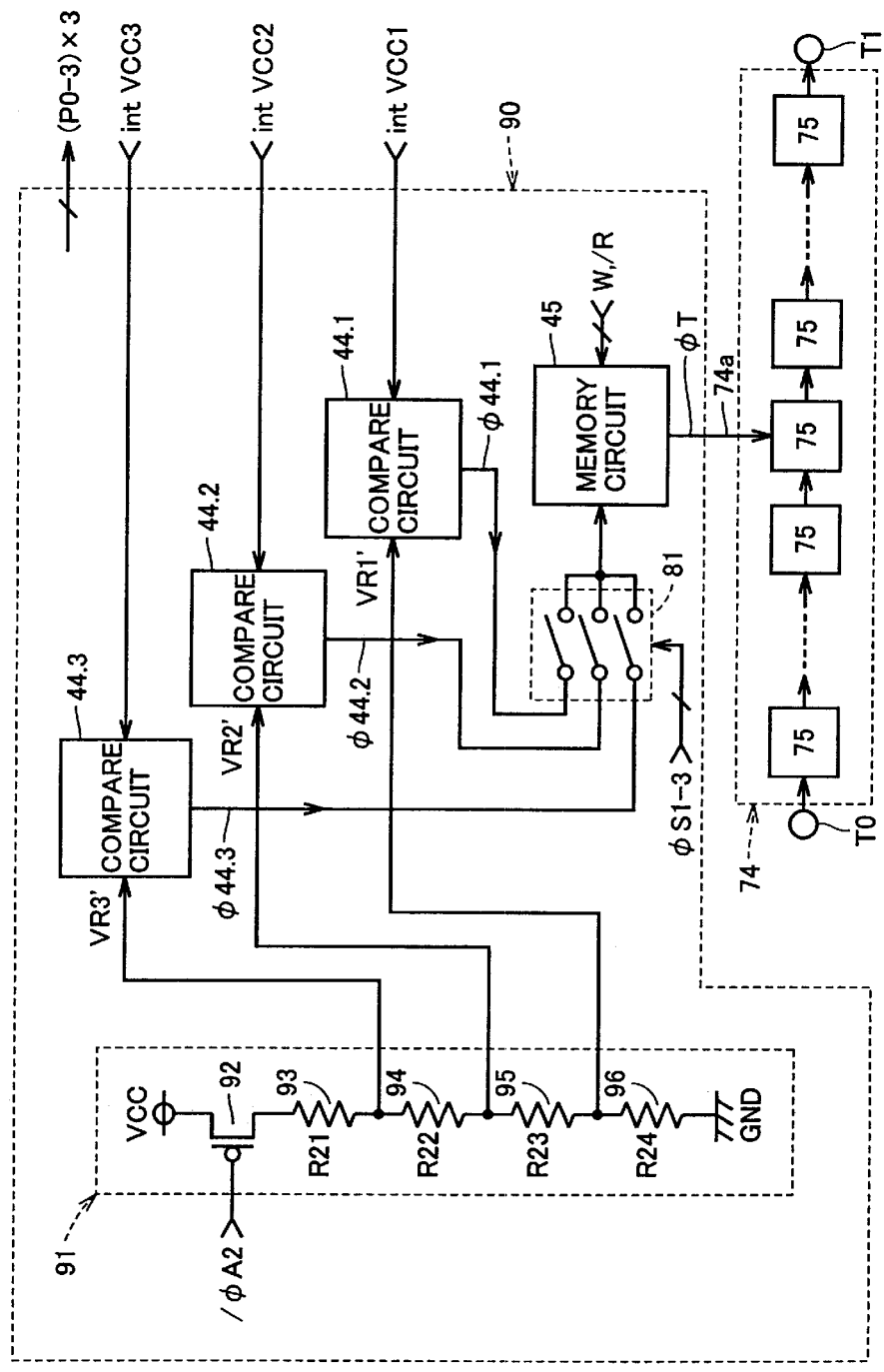
FIG. 16 illustrates another modification of the system LSI according to the fourth embodiment.

FIG. 16 shows a tuning circuit 90 obtained by replacing the voltage dividing circuit 84 of the tuning circuit 83 shown in FIG. 15 with a voltage dividing circuit 91. The voltage dividing circuit 91 includes a P-channel MOS transistor 92 and resistive elements 93 to 96 serially connected between a line of an external power supply potential VCC and a line of a ground potential GND. The gate of the P-channel MOS transistor 92 receives a signal /φA2. Therefore, the voltage dividing circuit 91 is activated only in compare periods of compare circuits 44.1 to 44.3. Resistance values R21 to R24 of the resistive elements 93 to 96 are set to predetermined ratios. Nodes between the resistive elements 96 and 95, between the resistive elements 95 and 94 and between the resistive elements 94 and 93 output reference potentials VR1', VR2' and VR3' respectively.

Internal power supply potentials intVCC1 to intVCC3 are simultaneously tuned. The compare circuits 44.1 to 44.3 compare the reference potentials VR1' to VR3' with the internal power supply potentials intVCC1 to intVCC3 respectively. A switching circuit 81 sequentially supplies output signals φ44.1 to φ44.3 from the compare circuits 44.1 to 44.3 to a memory circuit 45 every time the single step shown in FIG. 9 is terminated. According to this modification, the three internal power supply potentials intVCC1 to intVCC3 can be tuned in parallel with each other, whereby the tuning time can be reduced.

Figure 17:
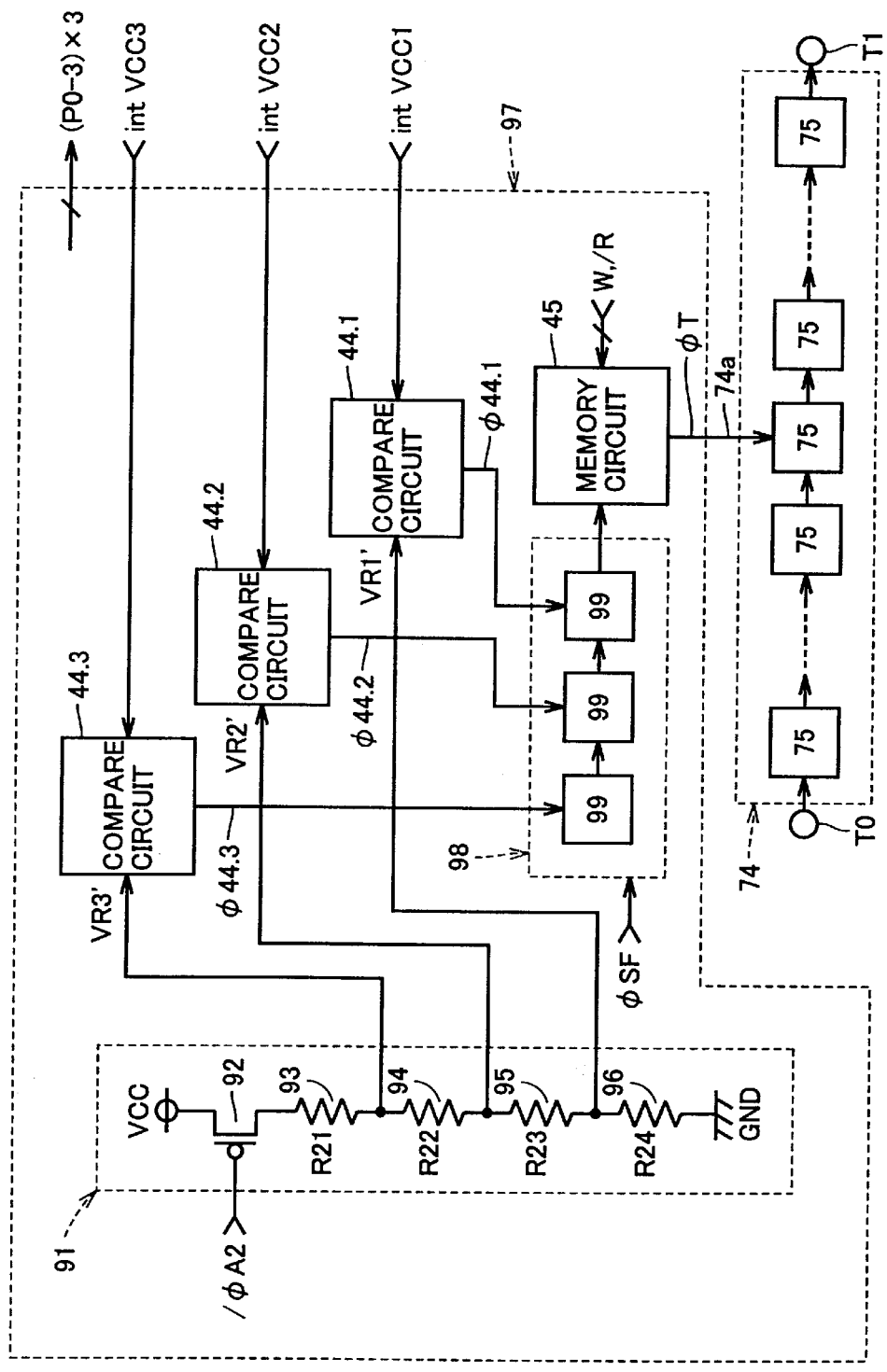
FIG. 17 illustrates still another modification of the system LSI according to the fourth embodiment.

FIG. 17 shows a tuning circuit 97 obtained by replacing the switching circuit 81 of the tuning circuit 90 shown in FIG. 16 with a shift register 98. The shift register 98 includes three serially connected registers 99. Output signals φ44.1 to φ44.3 from compare circuits 44.1 to 44.3 are temporarily stored in the three registers 99 respectively every time the single step shown in FIG. 9 is terminated. The signals φ44.1 to φ44.3 stored in the three registers 99 are sequentially supplied one by one to a memory circuit 45 responsively when a signal φSF is brought into a high level. According to this modification, the shift register 98 serially transfers the output signals φ44.1 to φ44.3 from the compare circuits 44.1 to 44.3 to the memory circuit 45, whereby the total length of signal wires can be reduced as compared with the case of employing the switching circuit 81, and the layout area of the signal wires can be reduced.

Figure 18:
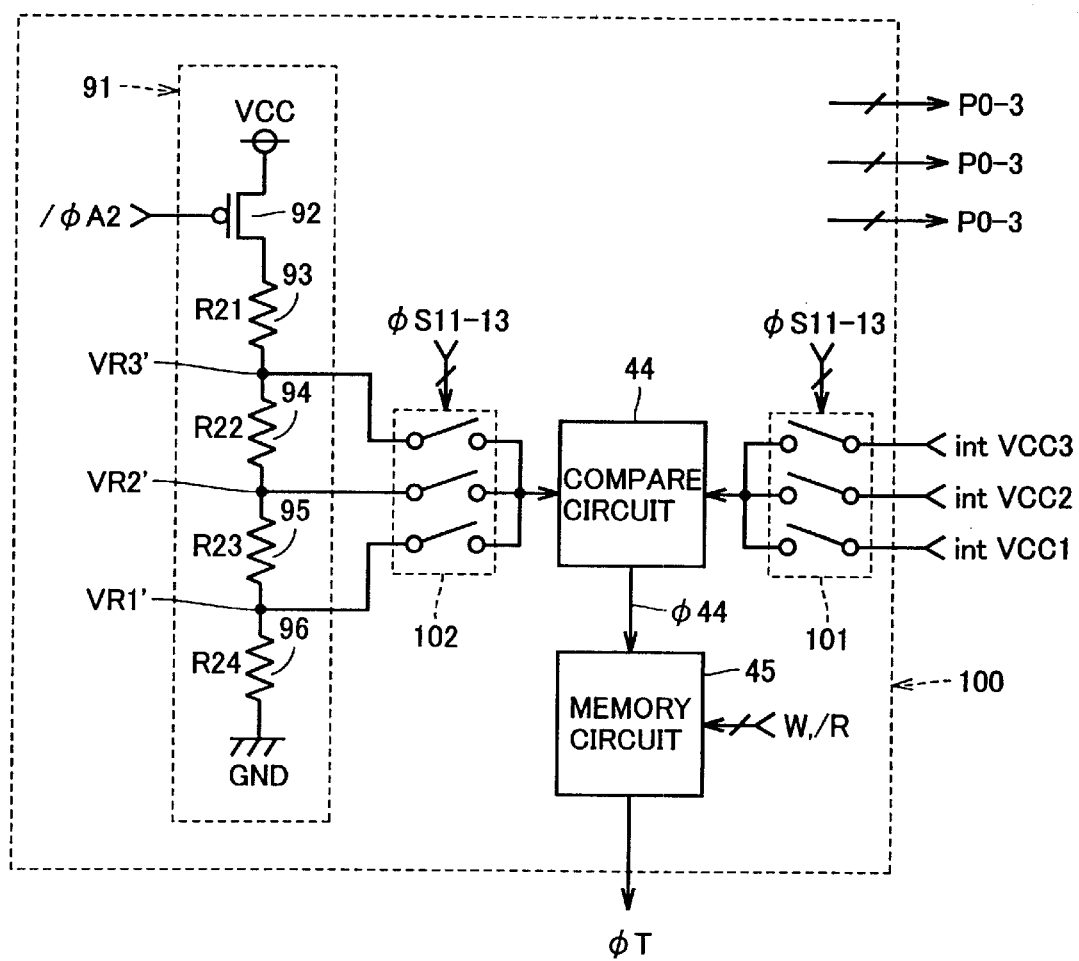
FIG. 18 illustrates a further modification of the system LSI according to the fourth embodiment.

FIG. 18 shows a tuning circuit 100 comprising a switching circuit 101 for selecting any one of three internal power supply potentials intVCC1 to intVCC3 along control signals φS11 to φS13, a switching circuit 102 for selecting any one of three reference potentials VR1' to VR3' generated in a voltage dividing circuit 91 along the control signals φS11 to φS13, a compare circuit 44 for comparing the internal power supply potential selected by the switching circuit 101 with the reference potential selected by the switching circuit 102 and a memory circuit 45 for temporarily storing an output signal φ44 from the compare circuit 44 and thereafter outputting the same to an external device through a scan path circuit 74. In each step, the switching circuits 101 and 102 sequentially select the internal power supply potential intVCC1 and the reference potential VR1', the internal power supply potential intVCC2 and the reference potential VR2' and the internal power supply potential intVCC3 and the reference potential VR3' by prescribed times after the internal power supply potentials intVCC1 to intVCC3 are stabilized, and the output signal φ44 from the compare circuit 44 is supplied to the memory circuit 45. This modification requires only a single compare circuit 44, whereby the layout area can be reduced.

While the voltage dividing circuit 84 (or 91) is provided in a single chip in each of these modifications, such a single voltage dividing circuit 84 (or 91) may alternatively be provided in common for a plurality of chips formed on a single semiconductor wafer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an internal potential generation circuit configured to receive a first level set signal including information indicating the level of an internal potential and to generate an internal potential of a level responsive to said first level set signal;
   a signal generation circuit configured to sequentially supply a plurality of second level set signals one by one as said first level set signal to said internal potential generation circuit and to control said internal potential generation circuit to generate a plurality of internal potentials of levels different from each other in a tuning mode for tuning said internal potential; and
   a first compare circuit configured to compare each said internal potential generated in said internal potential generation circuit with a reference potential and output a signal of a level responsive to the result of comparison in said tuning mode;
   said internal potential generation circuit includes,
      an internal reference potential generation circuit configured to generate an internal reference potential having a level in accordance with said first level setting signal, and
      a driver having a second compare circuit configured to compare said internal reference potential with a potential of an output node, and based on the result of comparison by the second compare circuit, holding the potential of said output node at said internal reference potential,
   the potential of said output node being said internal potential.

2. The semiconductor device according to claim 1, further comprising a memory circuit for storing said signal output from said compare circuit.

3. The semiconductor device according to claim 2, further comprising:
   an internal circuit configured to receive said internal potential generated in said internal potential generation circuit and to perform a prescribed operation, a plurality of signal terminals for transferring signals between said internal circuit and an external world, and
   a scan path circuit connected between two predetermined signal terminals among said plurality of signal terminals for testing said internal circuit, wherein
      an output signal from said memory circuit is able to be output to the external world through said scan path circuit.

4. The semiconductor device according to claim 2, wherein
   a plurality of said internal potential generation circuits are provided,
   said plurality of internal potential generation circuits configured to generate internal potentials of levels different from each other in response to the same first level set signal, and
   said plurality of internal potentials are tuned at timings different from each other, and
   said semiconductor device further comprises:
      a voltage dividing circuit including a plurality of resistive elements serially connected between a line of an external power supply potential and a line of a ground potential for generating a plurality of reference potentials corresponding to said plurality of internal potentials respectively, and
      a switching circuit for receiving said plurality of internal potentials and said plurality of reference potentials and supplying currently tuned said internal potential and said reference potential corresponding thereto to said compare circuit.

5. The semiconductor device according to claim 4, further comprising:
   an internal circuit configured to receive said internal potential generated in said internal potential generation circuit and perform a prescribed operation,
   a plurality of signal terminals, and for transferring signals between said internal circuit and an external world, and
   a scan path circuit connected between two predetermined signal terminals among said plurality of signal terminals for testing said internal circuit, wherein
      an output signal from said internal circuit is output to the external world through said scan path circuit.

6. The semiconductor device according to claim 1, further comprising:
   a detection circuit configured to detect the second level set signal for generating an internal potential substantially equal to said reference potential on the basis of said signal output from said compare circuit, and wherein
      said memory circuit is configured to store the second level set signal detected by said detection circuit.

7. The semiconductor device according to claim 6, wherein
   said compare circuit is configured to output a signal of a first or second level in response to whether said internal potential generated in said internal potential generation circuit is higher or lower than said reference potential, and
   said detection circuit includes:
      a logic circuit configured to output an activation signal in response to change of the level of said signal from said compare circuit, and
      a gate circuit configured to receive the second level set signals generated in said signal generation circuit and configured to supply the second level set signal to said memory circuit in response to said activation signal output from said logic circuit.

8. The semiconductor device according to claim 6, further comprising:
   an internal circuit configured to receive said internal potential generated in said internal potential generation circuit and configured to perform a prescribed operation,
   a plurality of signal terminals for transferring signals between said internal circuit and an external world, and
   a scan path circuit connected between two predetermined signal terminals among said plurality of signal terminals for testing said internal circuit, wherein
      an output signal from said memory circuit is able to be output to the external world through said scan path circuit.

9. The semiconductor device according to claim 6, further comprising:
   a program circuit including at least one fuse for generating a third level set signal including information indicating the level of said internal potential on the basis of whether or not said fuse is blown,
a switching circuit configured to supply the second level set signal generated in said signal generation circuit as said first level set signal to said internal potential generation circuit in said tuning mode while supplying the third level set signal generated in said program circuit as said first level set signal to said internal potential generation circuit in a general operation, and
a blowing circuit configured to blow said fuse of said program circuit so that said program circuit is able to output the third level set signal including the same information as the second level set signal stored in said memory circuit.

10. The semiconductor device according to claim 1, further comprising:
a program circuit including at least one fuse for generating a third level set signal including information indicating the level of said internal potential on the basis of whether or not said fuse is blown, and
a switching circuit configured to supply the second level set signal generated in said signal generation circuit as said first level set signal to said internal potential generation circuit in said tuning mode while supplying the third level set signal generated in said program circuit as said first level set signal to said internal potential generation circuit in a general operation.

11. The semiconductor device according to claim 1, wherein
said semiconductor device operates in synchronization with an external clock signal, and
further comprises a frequency dividing circuit configured to divide the frequency of said external clock signal and output an internal clock signal,
said signal generation circuit is configured to operate in synchronization with said internal clock signal and to sequentially supply said plurality of second level set signals one by one as said first level set signal to said internal potential generation circuit in a predetermined cycle, and
said compare circuit is configured to compare each said internal potential with said reference potential when a predetermined time elapses after said signal generation circuit supplies the second level set signal as said third level set signal to said internal potential generation circuit.

12. The semiconductor device according to claim 1, further comprising a voltage dividing circuit configured to divide an external power supply voltage and generate said reference potential.

13. The semiconductor device according to claim 1, wherein
said internal potential generation circuit includes:
a constant current source connected between a line of an external power supply potential and a prescribed node,
a variable resistance circuit, connected between said prescribed node and a line of a ground potential, having a resistance value varying with said first level set signal,
a transistor connected between said line of said external power supply potential and a line of said internal potential, and
a control circuit configured to control an input voltage of said transistor so that said internal potential matches with the potential of said prescribed node.

14. The semiconductor device according to claim 1, wherein
a plurality of said internal potential generation circuits and a plurality of said compare circuits are provided,
said plurality of internal potential generation circuits are configured to generate internal potentials of levels different from each other in response to the same first level set signal,
each said compare circuit is configured to receive a reference potential of a level responsive to corresponding said internal potential, and
said semiconductor device further comprises a memory circuit configured to store signals output from said plurality of compare circuits.

15. The semiconductor device according to claim 14, said plurality of internal potentials are tuned at timings different from each other, and
said semiconductor device further comprising:
an input terminal for inputting a reference potential of a level responsive to currently tuned said internal potential, and
a switching circuit for receiving said signals output from said plurality of compare circuits and for supplying said signal output from said compare circuit corresponding to said currently tuned potential to said memory circuit.

16. The semiconductor device according to claim 14, said plurality of internal potentials are tuned at timings different from each other, and
said semiconductor device further comprising:
a voltage dividing circuit for dividing an external power supply voltage and for generating a reference potential of a level responsive to currently tuned said internal potential, and
a switching circuit for receiving said signals output from said plurality of compare circuits and for supplying said signal output from said compare circuit corresponding to said currently tuned potential to said memory circuit.

17. The semiconductor device according to claim 14, wherein said plurality of internal potentials are tuned at the same timing, and said semiconductor device further comprising:
a voltage dividing circuit including a plurality of resistive elements serially connected between a line of an external power supply potential and a line of a ground potential, and for generating a plurality of reference potentials of levels responsive to said plurality of internal potentials respectively and for supplying said plurality of reference potentials to said plurality of compare circuits respectively, and
a switching circuit for sequentially supplying said signals output from said plurality of compare circuits one by one to said memory circuit every time said signal generation circuit outputs the second level set signal.

18. The semiconductor device according to claim 14, wherein said plurality of internal potentials are tuned at the same timing, and
said semiconductor device further comprising:
a voltage dividing circuit including a plurality of resistive elements serially connected between a line of an external power supply potential and a line of a ground potential, and for generating a plurality of reference potentials of levels responsive to said plurality of internal potentials respectively and for supplying said plurality of reference potentials to said plurality of compare circuits respectively, and a shift register including a plurality of serially connected registers provided in correspondence to said plurality of compare circuits respectively for temporarily storing said signals output from corresponding said compare circuits respectively, and for sequentially supplying data stored in said plurality of registers one by one to said memory circuit every time said signal generation circuit outputs the second level set signal.

19. The semiconductor device according to claim 14, further comprising:

an internal circuit configured to receive said internal potential generated in said internal potential generation circuit and perform a prescribed operation, a plurality of signal terminals for transferring signals between said internal circuit and an external world, and a scan path circuit connected between two predetermined signal terminals among said plurality of signal terminals, for testing said internal circuit, wherein an output signal from said memory circuit is able to be output to the external world through said scan path circuit.

* * * * *